United States Patent
Kudo et al.

(10) Patent No.: US 11,349,100 B2
(45) Date of Patent: May 31, 2022

(54) LIGHT EMITTING APPARATUS

(71) Applicant: Sony Corporation, Tokyo (JP)

(72) Inventors: Yasuyuki Kudo, Miyagi (JP); Jiro Yamada, Kanagawa (JP); Seiichiro Jinta, Kanagawa (JP); Shigeyuki Matsunami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/738,525

(22) Filed: Jan. 9, 2020

(65) Prior Publication Data

US 2020/0152917 A1 May 14, 2020

Related U.S. Application Data

(63) Continuation of application No. 16/248,891, filed on Jan. 16, 2019, now Pat. No. 10,541,383, which is a continuation of application No. 15/984,903, filed on May 21, 2018, now Pat. No. 10,243,170, which is a continuation of application No. 15/352,776, filed on Nov. 16, 2016, now Pat. No. 10,020,467, which is a continuation of application No. 14/312,115, filed on Jun. 23, 2014, now Pat. No. 9,515,291.

(30) Foreign Application Priority Data

Jul. 5, 2013 (JP) ................................. 2013-142039

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01); *H01L 27/3246* (2013.01); *H01L 51/5253* (2013.01); *H01L 51/5284* (2013.01)

(58) Field of Classification Search
CPC ............... H01L 51/5271; H01L 27/322; H01L 27/3246; H01L 51/5253; H01L 51/5284; H01L 51/5272; H01L 51/53
See application file for complete search history.

(56) References Cited

U.S. PATENT DOCUMENTS 8,408,775 B1 4/2013 Coleman
9,515,291 B2 * 12/2016 Kudo .................. H01L 27/3246
(Continued)

FOREIGN PATENT DOCUMENTS

JP 2003-249376 9/2003
JP 2004-177481 6/2004
(Continued)

OTHER PUBLICATIONS

Japanese Office Action dated Dec. 6, 2016 in corresponding Japanese Application No. 2013-142039.
(Continued)

*Primary Examiner* — Shih Tsun A Chou
(74) *Attorney, Agent, or Firm* — K&L Gates LLP

(57) ABSTRACT

Provided is a light emitting apparatus including a substrate including a plurality of light emitting devices, wherein the substrate further includes a plurality of first members configured to diffuse light emitted from at least one of the light emitting devices, and a second member that is positioned between the first members, wherein the second member includes a light absorbing layer.

21 Claims, 21 Drawing Sheets

(56) References Cited

U.S. PATENT DOCUMENTS

| | | |
|---|---|---|
| 2003/0107314 A1 | 6/2003 | Urabe et al. |
| 2004/0113550 A1* | 6/2004 | Adachi ............... H01L 51/5271 |
| | | 313/512 |
| 2005/0001963 A1 | 1/2005 | Yokoyama |
| 2007/0063645 A1 | 3/2007 | Yokoyama |
| 2007/0123135 A1 | 5/2007 | Yang et al. |
| 2008/0297908 A1 | 12/2008 | Adachi et al. |
| 2009/0115302 A1 | 6/2009 | Tchakarov |
| 2009/0215352 A1 | 8/2009 | Nishikawa et al. |
| 2011/0031480 A1* | 2/2011 | Nakamura .......... H01L 51/5234 |
| | | 257/40 |
| 2013/0302937 A1 | 11/2013 | Jinbo |
| 2014/0028181 A1 | 1/2014 | Lee |
| 2014/0034723 A1 | 2/2014 | Van Horn et al. |

FOREIGN PATENT DOCUMENTS

| | | |
|---|---|---|
| JP | 2004-288447 | 10/2004 |
| JP | 2005-322633 | 11/2005 |
| JP | 2006-135358 | 5/2006 |
| JP | 2010-034074 | 2/2010 |
| JP | 2013-020936 | 1/2013 |
| JP | 2013-030293 | 2/2013 |
| JP | 2013-122835 | 6/2013 |

OTHER PUBLICATIONS

Japanese Office Action dated Feb. 21, 2017 in corresponding Japanese Application No. 2013-142039.
Chinese Office Action dated Mar. 2, 2018 in corresponding Chinese Application No. 2014103028494.

* cited by examiner

LIGHT EMITTING APPARATUS

CROSS REFERENCES TO RELATED APPLICATIONS

The present application is a continuation of U.S. patent application Ser. No. 16/248,891, filed on Jan. 16, 2019, which application is a continuation of U.S. patent application Ser. No. 15/984,903, filed on May 21, 2018, issued as U.S. Pat. No. 10,243,170 on Mar. 26, 2019, which application is a continuation of U.S. patent application Ser. No. 15/352,776, filed on Nov. 16, 2016, issued as U.S. Pat. No. 10,020,467 on Jul. 10, 2018, which application is a continuation of U.S. patent application Ser. No. 14/312,115, filed on Jun. 23, 2014, issued as U.S. Pat. No. 9,515,291 on Dec. 6, 2016, which application claims priority to Japanese Priority Patent Application JP 2013-142039 filed in the Japan Patent Office on Jul. 5, 2013, the entire content of which is hereby incorporated by reference.

BACKGROUND

The present disclosure relates to a light emitting apparatus, specifically to a light emitting apparatus including a light emitting device.

Recently, lighting systems and organic electronic luminescence light emitting apparatuses (hereinafter, simply referred to as an organic EL light emitting apparatuses) that use organic electronic luminescence device (hereinafter, simply referred to as an organic EL device) as light emitting devices have come into wide use. Subsequently, for the organic EL light emitting apparatus, a technique of efficiently emitting light has to be developed. If light extraction efficiency is poor, it means that an actually generated amount of light from the organic EL device is not effectively utilized, and a great loss occurs in the electric power consumption and the like.

In order to enhance the light extraction efficiency, an organic EL light emitting apparatus having a reflector (reflecting mechanism) is disclosed, for example, in Japanese Unexamined Patent Application Publication No. 2004-177481. In the organic EL light emitting apparatus, light that is emitted to the front side from a light emitting layer passes through a transparent layer. Here, light at a large angle from among light emitted to the front side is reflected by a reflector (reflecting mechanism) provided in the transparent layer and emitted to the outside. In addition, in the organic EL light emitting apparatus disclosed in the patent application publication, a low-reflection layer for preventing external light from being reflected is provided on the opposite side of the transparent layer to the light emitting layer.

SUMMARY

Here, there are non-luminous regions between light emitting regions that actually emit light in a general organic EL light emitting apparatus. In addition, the ratio of the non-luminous regions to the entire area of the luminous regions and the non-luminous regions is 0.5 or more, in some cases. Accordingly, if the external light is reflected on the non-luminous region and emitted from the organic EL light emitting apparatus, a decrease in contrast is caused.

Accordingly, it is desirable to provide a light emitting apparatus having the configurations and structures in which it is difficult for the external light to be reflected in the non-luminous region.

According to an embodiment of the present disclosure, there is provided a light emitting apparatus including a substrate including a plurality of light emitting devices, wherein the substrate further includes a plurality of first members configured to diffuse light emitted from at least one of the light emitting devices, and a second member that is positioned between the first members, and wherein the second member includes a light absorbing layer.

According to an embodiment, the light absorbing layer is in proximity of an outside portion of the second member.

According to an embodiment, there is provided an electronic apparatus including a light emitting apparatus including a substrate, the substrate including a plurality of light emitting devices, wherein the substrate further includes a plurality of first members and a second member positioned between the first members, wherein the first members are configured to diffuse and emit light, and wherein the second member includes a light absorbing layer.

According to an embodiment of the present disclosure, the electronic apparatus includes a mobile device.

According to an embodiment of the present disclosure, the mobile device is a tablet or a smartphone.

According to an embodiment of the present disclosure, there is provided a light emitting apparatus, including (A) a first substrate that includes a plurality of light emitting devices each obtained by stacking a first electrode, a light emitting unit configured with an organic layer including a light emitting layer, and a second electrode; and (B) a second substrate that faces the first substrate, in which the first substrate includes a first member that diffuses light from each light emitting device and emits the light to the outside, and a second member that occupies portions between the first members, and a light absorbing layer is provided in the second member.

According to the light emitting apparatus of the present disclosure, the first substrate includes first members that diffuse light from each light emitting device and emit the light to the outside and second members that occupy portions between the first members, and a light absorbing layer is provided in the second members. Therefore, since the external light that enters the second member is absorbed by the light absorbing layer, it is difficult for the light to be emitted from the light emitting apparatus to the outside. Accordingly, the contrast of the light emitting apparatus can be increased. Further, the advantages described in the present specification are merely examples and are not intended to limit the present disclosure. In addition, additional advantages may be provided.

Additional features and advantages are described herein, and will be apparent from the following Detailed Description and the figures.

DETAILED DESCRIPTION

Figure 1:
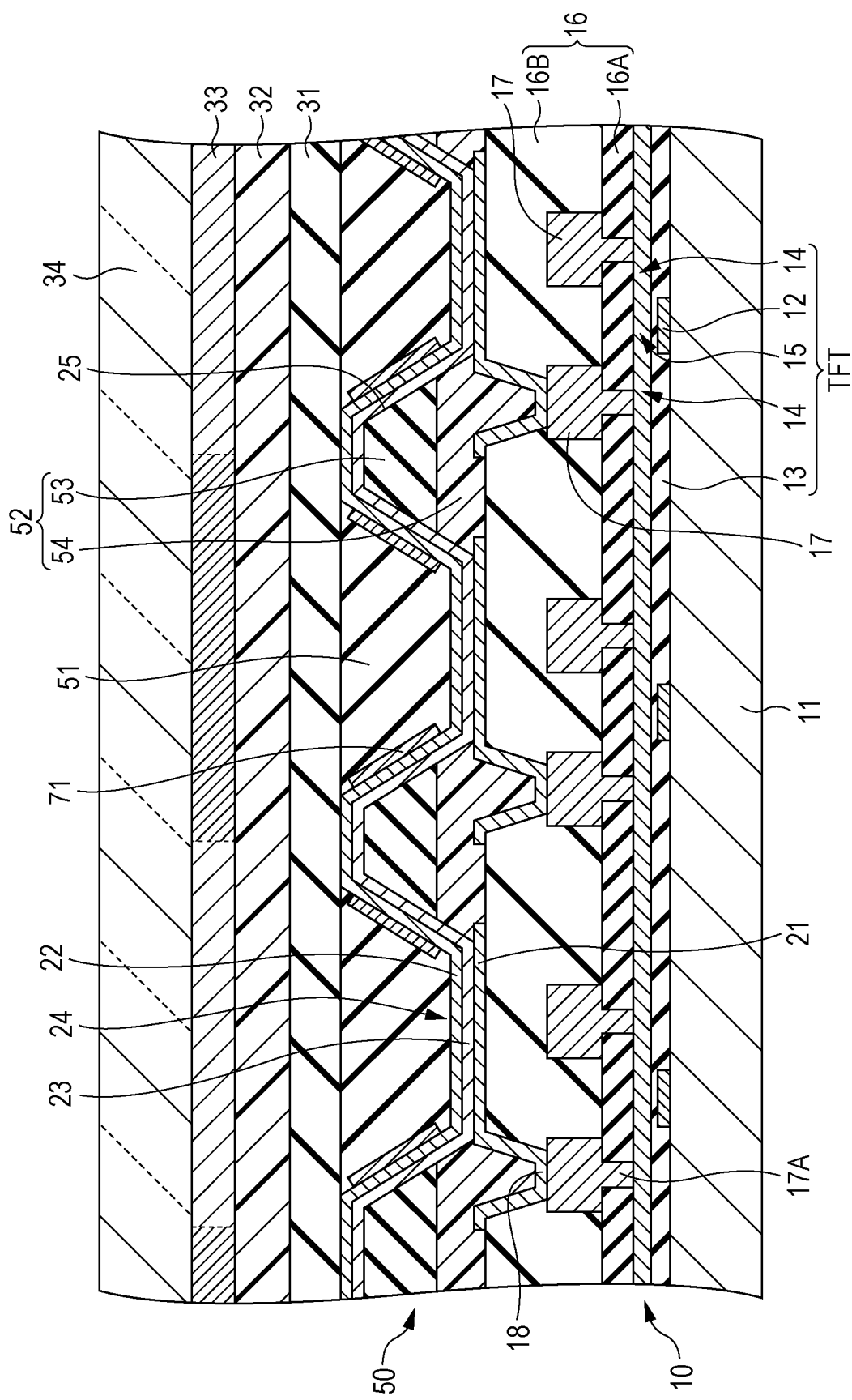
FIG. 1 is a schematic partial cross-sectional view of a light emitting apparatus according to Example 1.

Hereinafter, with reference to the drawings, the present disclosure will be described based on examples, but the present disclosure is not limited to the examples and various numerical values and materials according to the examples are given as examples. Further, the description is given in the order as described below.

The present disclosure relates to a light emitting apparatus. It should be understood by those skilled in the art that the light emitting apparatus can be utilized in a number of suitable applications including, for example, a display including a display for an electronic apparatus, wherein the electronic apparatus includes a mobile device and the like, such as a tablet, a smartphone, and the like, and wherein the light emitting apparatus can be configured to be a part of the electronic apparatus in any suitable manner such that the electronic apparatus can function in any suitable manner.

1. Light emitting apparatus of the present disclosure, General description

2. Example 1 (Light emitting apparatus of the present disclosure, Light emitting apparatus according to first and second embodiments of the present disclosure)

3. Example 2 (Modification of Example 1)

4. Example 3 (Another modification of Example 1)

5. Example 4 (Still another modification of Example 1)

6. Example 5 (Still another modification of Example 1)

7. Example 6 (Still another modification of Example 1; Light emitting apparatus according to first and third embodiments)

8. Example 7 (Modification of Example 6)

9. Example 8 (Another modification of Example 6)

10. Example 9 (Still another modification of Example 6)

11. Example 10 (Still another modification of Example 1; Light emitting apparatus according to first and fourth embodiments of the present disclosure), and the like Light emitting apparatus of the present disclosure, General description The light emitting apparatus of the present disclosure may have a configuration in which at least a portion of light diffused in a first member is reflected on an interface between the first member and a second member. Further, a light emitting apparatus configured as above is referred to as a "light emitting apparatus according to a first embodiment of the present disclosure", for convenience.

Otherwise, the light emitting apparatus of the present disclosure may have a configuration in which a light reflecting film is formed at the interface between the first member and the second member. Further, a light emitting apparatus configured as above is referred to as a "light emitting apparatus according to a second embodiment of the present disclosure", for convenience. In the light emitting apparatus according to the second embodiment of the present disclosure, the light diffused in the first member is partially or totally reflected depending on the material configuring the light reflecting film.

Otherwise, the light emitting apparatus of the present disclosure may have a configuration in which $1.1 \le n_1 \le 1.8$ and preferably $1.2 \le n_1 \le 1.6$ are satisfied, and $n_1 - n_{2\text{-}ave} \ge 0.2$ and preferably $n_1 - n_{2\text{-}ave} \ge 0.3$ are satisfied, when a refractive index of a material configuring the first member is $n_1$, and an average refractive index of a material configuring the second member that includes the light absorbing layer is $n_{2\text{-}ave}$. Further, a light emitting apparatus configured as above is referred to as a "light emitting apparatus according to a third embodiment of the present disclosure", for convenience. In addition, when the refractive index of a material configuring the second member except for the light absorbing layer is $n_2$, and the refractive index of a material configuring the light absorbing layer is $n_2'$, it is preferable that $n_1 - n_2 \ge 0.2$ and preferably $n_1 - n_2 \ge 0.3$ are satisfied, and $n_1 - n_2' \ge 0.2$ and preferably $n_1 - n_2' \ge 0.3$ are satisfied.

In this manner, since the refractive index $n_1$ and difference between the refractive index $n_1$ and the average refractive index $n_{2-ave}$ are regulated in the light emitting apparatus according to the third embodiment of the present disclosure, even if a light reflecting member or the like is not provided at the interface between the first member and the second member, the light extraction efficiency of the light from the light emitting device to the outside can be further increased.

The light emitting apparatus according to the third embodiment of the present disclosure may have a configuration in which a second electrode is formed between the first member and the second member or an organic layer and a second electrode is formed between the first member and the second member. In this case, at least a portion of light diffused in the first member is reflected at the interface between the second member and the second electrode, or between the second member and the organic layer. However, these configurations are also included in a configuration in which "at least a portion of light diffused in the first member is reflected on the interface between the first member and the second member".

The light emitting apparatus according to the second embodiment of the present disclosure and the light emitting apparatus according to the third embodiment of the present disclosure can be manufactured based on each step of:

forming an interlayer insulating layer on a first substrate and forming a first electrode on the interlayer insulating layer;

obtaining a second member in which an inclined plane of an opening is inclined by forming a second member forming layer (including a light absorbing layer) on the first electrode and the interlayer insulating layer and selectively removing the second member forming layer on the first electrode;

forming an organic layer and a second electrode from the first electrode exposed at the lower portion of the opening to the inclined plane of the opening, and subsequently, in the light emitting apparatus according to the second embodiment of the present disclosure, forming a light reflecting film on the inclined plane of the opening; and forming a first member on the second electrode, or each step of:

preparing a stamper having a shape complementary to the first member;

applying a resin material on a supporting substrate;

obtaining a resin material layer having convex portions by shaping the resin material using the stamper and removing the stamper;

planarizing top portions of the convex portions of the resin material layer, and subsequently, in the light emitting apparatus of the second embodiment of the present disclosure, forming the light reflecting film on the convex portions, and then embedding an adhesive agent layer in portions between convex portions of the resin material layer; and removing a resin material layer from the supporting substrate, bonding the adhesive agent layer to the first substrate and obtaining a second member (including a light absorbing layer) made with the adhesive agent layer and a first member made with the resin material layer.

In the method of manufacturing the light emitting apparatus, since the first member can be directly formed on the second electrode, there is no loss in extracting light emitted from a light emitting device which is caused by the existence of an adhesive layer between the second electrode and a reflector. Otherwise, the first member made with the resin material layer and the second member made with the adhesive agent layer can be obtained by using the stamper. Accordingly, the organic EL light emitting apparatus in which the light extraction efficiency of light from the light emitting device to the outside can be further increased can be manufactured with a simple manufacturing method.

Otherwise, the light emitting apparatus of the present disclosure may have a configuration in which the light reflecting member that reflects at least a portion of light being emitted from the light emitting device, passing through the first member, and entering the second substrate from the first surface of the second substrate, and that emits the light from the second surface of the second substrate is formed on the second substrate. Further, a light emitting apparatus configured as above is referred to as a "light emitting apparatus according to a fourth embodiment of the present disclosure", for convenience. Though it depends on configuring materials, the second substrate provided with a light reflecting member can be manufactured, for example, by a method of forming concave portions on a first surface using a stamper or forming concave portions on a first surface based on a cutting process, forming a light reflecting member on a surface exposed to the concave portions, and then embedding the concave portions.

The light reflecting film of the light emitting apparatus according to the second embodiment of the present disclosure, the surface (or an interface between the first member and the second member) of the second member that faces the first member of the light emitting apparatus according to the third embodiment of the present disclosure, and the light reflecting member of the light emitting apparatus according to the fourth embodiment of the present disclosure are collectively referred to as a "light reflecting portion" or a "reflector" for convenience.

The light emitting apparatus of the present disclosure having various preferred configurations described above further includes:

a protecting film and a sealing material layer on the first member and the second member, in which $$|n_3 - n_4| \le 0.3$$

and preferably $$|n_3 - n_4| \le 0.2$$

can be satisfied, when a refractive index of a material configuring the protecting film is $n_3$, and a refractive index of a material configuring the sealing material layer is $n_4$. According to this, light can be effectively prevented from being reflected or diffused on the interface between the protecting film and the sealing material layer. Further, it may be configured so that the first member and the protecting film are integrated by forming the first member and the protecting film at the same time. In addition, the following upper surface light emitting-type light emitting apparatus having preferred configurations as above may be configured so that when the light amount of the light from the center portion of the light emitting device is set to be 1, the light amount of the light emitted from the light emitting device to the outside through the first member and the second substrate is 1.5 to 2.0.

As described above, the light absorbing layer is provided in the second member in the light emitting apparatus of the present disclosure, but specifically, in the light emitting apparatus of the present disclosure which has preferred configurations described above, the second member may be configured to have a structure in which the light absorbing layer and other layers (referred to as a "second member configuring layer", for convenience) are stacked, or the second member may be configured to have the light absorbing layer (that is, the light absorbing layer occupies the entire portion of the second member). Subsequently, in the former structure, the light absorbing layer can be provided in the lower portion of the second member (that is, a structure in which the second member and second member configuring layer are stacked from the first substrate), the light absorbing layer can be provided in the middle portion of the second member (that is, a structure in which the second member configuring layer, the light absorbing layer, and the second member configuring layer are stacked from the first substrate), or the light absorbing layer can be provided on the top portion of the second member (that is, a structure in which the second member configuring layer and the second member are stacked from the first substrate). Further, two or more of the light absorbing layer may be formed.

Further, the light emitting apparatus of the present disclosure having the preferred configurations and structures described above may be configured to include a color filter.

When the light emitting apparatus is a color light emitting apparatus, one pixel is configured with three sub-pixels of a red luminous sub-pixel that emits red light, a green luminous sub-pixel that emits green light, and a blue luminous sub-pixel that emits blue light, or configured with four or more sub-pixels. In the color light emitting apparatus, the red luminous sub-pixel may be configured with a light emitting device that emits red light, the green luminous sub-pixel may be configured with a light emitting device that emits green light, and the blue luminous sub-pixel may be configured with a light emitting device that emits blue light. In the following upper surface light emitting-type light emitting apparatus of the present disclosure having the preferred configurations and structures described above, the second substrate may be configured to have a color filter, the light emitting device may be configured to emit white light, and each color luminous sub-pixel may be configured by combining a color filter and the light emitting device that emits white light. The second substrate may be configured to include a light shielding layer (black matrix). In the same manner, in the following lower surface light emitting-type light emitting apparatus, the first substrate may be configured to include a color filter or a light shielding layer (black matrix).

In addition, the light emitting apparatus of the present disclosure having the preferred configurations and structures described above may have a configuration in which the light emitting device and the first member are in contact with each other. According to this, since light emitted from the light emitting unit necessarily and directly enters the first member, the light extraction efficiency is not greatly decreased.

Additionally, the light emitting apparatus of the present disclosure having the preferred configurations and structures described above may have a configuration in which light from each light emitting device is emitted to the outside through the second substrate. Further, the light emitting apparatus as described above may be referred to as an "upper surface light emitting-type light emitting apparatus". However, the present disclosure is not limited to such configurations, and the light from each light emitting device can be emitted to the outside through the first substrate. Further, the light emitting apparatus as described above may be referred to as a "lower surface light emitting-type light emitting apparatus".

The light reflecting film of the light emitting apparatus according to the second embodiment of the present disclosure and the light reflecting member of the light emitting apparatus according to the fourth embodiment of the present disclosure may be configured with, for example, an aluminum (Al) layer, an aluminum alloy layer (for example, an Al—Nd layer), a chromium (Cr) layer, a silver (Ag) layer, and a silver alloy layer (for example, an Ag—Pd—Cu layer, and an Ag—Sm—Cu layer), and can be formed by, for example, a deposition method including an electron beam vapor deposition method, a heat filament vapor deposition method, and a vacuum deposition method, a sputtering method, a CVD method, and an ion plating method; a plating method (an electroplating method or an electroless plating method); a lift-off method; a laser ablation method; and a sol-gel method.

Otherwise, the light reflecting film of the light emitting apparatus according to the second embodiment of the present disclosure may be configured with a material having a refractive index less than the refractive index $n_1$ of a material configuring the first member. Here, examples of a material configuring the light reflecting film as described above include a material configuring the second member of the light emitting apparatus according to the third embodiment of the present disclosure to be described below. In this case, examples of a material configuring the first member include a material configuring the first member of the light emitting apparatus according to the third embodiment of the present disclosure to be described below. Further, when the refractive index of the material configuring the light reflecting film as described above is $n_2''$, it is desirable to satisfy $$n_1 - n_2'' \geq 0.2 \text{ and preferably}$$

$$n_1 - n_2'' \geq 0.3.$$

In the light emitting apparatus according to the third embodiment of the present disclosure having the preferred configurations and structures described above, examples of a material configuring the first member include $Si_{1-x}N_x$, ITO, IZO, $TiO_2$, $Nb_2O_5$, a bromine-containing polymer, a sulfur-containing polymer, a titanium-containing polymer, or a zirconium-containing polymer, and examples of a material configuring the second member except for the light absorbing layer include $SiO_2$, MgF, LiF, a polyimide resin, an acrylic resin, a fluorine-based resin, a silicone resin, a fluorine-based polymer, or a silicone-based polymer.

In the light emitting apparatus of the present disclosure having the preferred configurations and structures described above except for the light emitting apparatus according to the third embodiment of the present disclosure, examples of a material configuring the first member, and also examples of a material configuring the second member except for the light absorbing layer include $SiO_2$, $Si_{1-x}N_x$, $TiO_2$, $Nb_2O_5$, MgF, LiF, a polyimide resin, an acrylic resin, a fluorine-based resin, a silicone resin, a fluorine-based polymer, a silicone-based polymer, a bromine-containing polymer, a sulfur-containing polymer, a titanium-containing polymer, and a zirconium-containing polymer.

Meanwhile, examples of a material configuring the light absorbing layer include carbon, a metal thin film (a thin film made with, for example, chromium, nickel, aluminum, molybdenum, or an alloy thereof), metallic oxide (for example, chromium oxide), metal nitride (for example, chromium nitride), an organic resin, a glass paste containing a black pigment and the like, and various resins containing a black dye or a black pigment such as carbon black. Specifically, examples of the material configuring the light absorbing layer include a photosensitive polyimide resin, chromium oxide, and a chromium oxide/chromium laminated film. The light absorbing layer may be formed by a method appropriately selected from, for example, a combination of a vacuum deposition method or a sputtering method and an etching method, a combination of a vacuum deposition method or a sputtering method, a spin coating method, and a lift-off method, a screening printing method, and a lithography technique, depending on a used material. The difference between the refractive index $n_2'$ of a material configuring the light absorbing layer and the refractive index $n_2$ of a material configuring the second member configuring layer is preferably as small as possible. The light absorbing layer refers to a layer with absorptivity of visible light of 90% or more, and preferably 99% or more.

As a material configuring the protecting film, it is preferable to use a material that is transparent to light emitted from the light emitting layer, that is dense, and that does not allow moisture to penetrate. Specifically, examples of the material configuring the protecting film include amorphous silicon ($\alpha$-Si), amorphous silicon carbide ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxynitride ($\alpha$-SiON), and Al$_2$O$_3$. In addition, examples of a material configuring the adhesive layer include a thermosetting adhesive agent such as an acrylic adhesive agent, an epoxy adhesive agent, a urethane adhesive agent, a silicone adhesive agent, a cyanoacrylate adhesive agent, and an ultraviolet ray curable adhesive agent.

In the light emitting apparatus of the present disclosure having the preferred configurations and structures described above (hereinafter, collectively referred to as a "light emitting apparatus of the present disclosure" in some cases) in which one pixel (or one sub-pixel) is configured with one light emitting device, though the present disclosure is not limited thereto, examples of an array of the pixel (or the sub-pixel) include a stripe array, a diagonal array, a delta array, or a rectangle array. In addition, in the light emitting apparatus of the present disclosure in which one pixel (or one sub-pixel) is configured by a plurality of light emitting device, though the present disclosure is not limited thereto, examples of an array of the pixel (or the sub-pixel) include a stripe array. A configuration in which a plurality of light reflecting portions (reflector) is provided for one light emitting device is possible and a configuration in which one light reflecting portion (reflector) is provided for one light emitting device is possible.

In the light emitting apparatus of the present disclosure and the like, the light reflecting portion is configured with a portion of the surface of the rotating body (truncated rotating body), and the cross section of the light reflecting portion when the axis line of the light reflecting portion that is a rotating axis of the rotating body is a z axis and the light reflecting portion cut through a virtual plane including the z axis is preferably configured in a trapezoid shape or with a portion of a parabola, but it may be configured by another structure. The rotating body may be configured with a sphere, a spheroid, and a paraboloid of revolution, or may be configured with a curved surface obtained by rotating a portion of a curve such as a two-leaf line, a three-leaf line, a four-leaf line, a lemniscate, a snail line, a folium, a conchoid, a cissoid, a probability curve, a tractrix, a catenary, a cycloid, a trochoid, an astroid, a semicubical parabola, a Lissajous curve, the witch of Agnesi, an epicycloid, a cardioid, a hypocycloid, a clothoid curve, and a spiral obtained by a third-order polynomial or higher. In addition, in some cases, the rotating body may be configured with a surface obtained by rotating one line segment, a combination of a plurality of line segments, or a combination of a line segment and a curve. Otherwise, the light reflecting portion may be configured with a pyramidal frustum (for example, a truncated triangular pyramid, a truncated quadrangular pyramid, a truncated hexagonal pyramid, a truncated octagonal pyramid, and the like). Further, examples of a visible outline of the light reflecting portion when the light reflecting portion is cut through the xy plane include a certain closed curve.

Otherwise, the light emitting apparatus according to the present disclosure may have a configuration in which one pixel (or one sub-pixel) is configured with one light emitting device, the first member has a truncated cone shape (or a truncated rotating body shape), and $$0.5 \leq R_1/R_2 \leq 0.8 \text{ and}$$

$$0.5 \leq H/R_1 \leq 2.0$$

are satisfied when a diameter of the light incident surface is $R_1$, a diameter of the light emitting surface is $R_2$, and a height is H. Further, the cross-section of the truncated cone-shaped inclined plane (a cross section obtained when the truncated cone shape is cut through a virtual plane including an axis line of the truncated cone shape; the same shape hereinafter) may be linear, may be a combination of a plurality of line segments, or may be configured with curves. It is preferable to satisfy $$0.5 \leq R_0/R_1 \leq 1.0,$$

when a diameter of the light emitting unit is $R_0$.

Otherwise, the light emitting apparatus according to the present disclosure may have a configuration in which one pixel (or one sub-pixel) is configured by a plurality of light emitting devices, the first member has a truncated cone shape (or a shape of a truncated rotating body), and $$0.5 \leq R_1/R_2 \leq 0.8 \text{ and}$$

$$0.5 \leq H/R_1 \leq 2.0$$

are satisfied, when a diameter of the light incident surface is $R_1$, a diameter of the light emitting surface is $R_2$, and a height is H. The number of the light emitting devices configuring one pixel (or one sub-pixel) may be in a range from 3 to 1000. Further, the cross-section of the truncated cone-shaped inclined plane may be linear, may be a combination of a plurality of line segments, or may be configured with curves. It is preferable to satisfy $$0.5 \leq R_0/R_1 \leq 1.0,$$

when a diameter of the light emitting unit is $R_0$.

Examples of the shortest distance (referred to as a "distance between structures" for convenience) between the top surfaces of the second members with respect to the neighboring light emitting devices include 0 µm, or include 2 µm or 4 µm, but the shortest distance is not limited thereto and vary depending on the specification for the light emitting apparatus.

When the first electrode of the upper surface light emitting-type light emitting apparatus or the second electrode of the lower surface light emitting-type light emitting apparatus (the electrodes are referred to as "light reflecting electrodes" in some cases for convenience) function as anode electrodes, examples of a material (light reflecting material) configuring the light reflecting electrode include, for example, a high work function metal such as platinum (Pt), gold (Au), silver (Ag), chromium (Cr), tungsten (W), nickel (Ni), copper (Cu), iron (Fe), cobalt (Co), or tantalum (Ta) or an alloy thereof (for example, an Ag—Pd—Cu alloy including silver as a main component, palladium (Pd) of 0.3% by mass to 1% by mass, and copper (Cu) of 0.3% by mass to 1% by mass or an Al—Nd alloy). Further, when the conductive material such as aluminum (Al), an alloy including aluminum with low values of the work functions, and high light reflectivity is used, the hole injection property is enhanced by appropriately providing the hole injecting layer so that the light reflecting electrode can be used as an anode electrode. Examples of the thickness of the light reflecting electrode include 0.1 μm to 1 μm. Otherwise, the light reflecting electrode may have a configuration in which a transparent conductive material having an excellent hole injection property such as indium tin oxide (ITO) and indium zinc oxide (IZO) is stacked on a dielectric multilayer or a light reflecting film with high reflectivity, such as aluminum (Al). Meanwhile, if the light reflecting electrode functions as a cathode electrode, it is desirable that the light reflecting electrode is configured with the conductive material with a low value of the work function and high light reflectivity, but the electron injecting property of the conductive material with high light reflectivity which is used as an anode electrode can be enhanced by providing an appropriate electron injecting layer so that the conductive material can be used as a cathode electrode.

Meanwhile, when the second electrode of the upper surface light emitting-type light emitting apparatus or the first electrode of the lower surface light emitting-type light emitting apparatus (hereinafter, the electrodes are referred to as "translucent electrodes" in some cases for convenience) function as cathode electrodes, it is desirable that a material (translucent material or light transmitting material) configuring the translucent electrode is configured with a conductive material that has a low work function so that the emitted light is transmitted and electrons are effectively injected into the organic layer. Examples of the material include a metal with a low work function such as aluminum (Al), silver (Ag), magnesium (Mg), calcium (Ca), sodium (Na), or strontium (Sr) or an alloy thereof, an alloy of an alkali metal or an alkali earth metal and a silver (Ag) [for example, an alloy of magnesium (Mg) and silver (Ag) (Mg—Ag alloy)], an alloy of magnesium and calcium (Mg—Ca alloy), and an alloy of aluminum (Al) and lithium (Li) (Al—Li alloy). Among them, an Mg—Ag alloy is preferable, and a volume ratio between magnesium and silver (Mg:Ag) may range from 5:1 to 30:1. Otherwise, a volume ratio between magnesium and silver (Mg:Ag) may range from 2:1 to 10:1. Examples of the thickness of the translucent electrode range from 4 nm to 50 nm, preferably 4 nm to 20 nm, and more preferably from 6 nm to 12 nm. Otherwise, the translucent electrode can be formed in a layered structure in which a material layer described above and a so-called transparent electrode (for example, with the thickness of $3 \times 10^{-8}$ m to $1 \times 10^{-6}$ m) made with, for example, ITO or IZO are layered, from the organic layer. In the case of the layered structure, the thickness of the material layer described above may be as thin as 1 nm to 4 nm. In addition, it is possible to configure the translucent electrode with the transparent electrode only. Otherwise, low resistivity on the entire body of the translucent electrode can be obtained by providing a bus electrode (auxiliary electrode) made with a material with low resistivity such as aluminum, an aluminum alloy, silver, a silver alloy, copper, a copper alloy, gold, a gold alloy, and the like, for the translucent electrode. Meanwhile, if the translucent electrode functions as an anode electrode, it is desirable that the translucent electrode is configured with a conductive material that transmits emitted light and also has a high value of the work function.

An average light reflectivity of the light reflecting electrode is 50% or higher, and preferably 80% or higher, and average light transmittance of the translucent electrode ranges from 50% to 90%, and preferably from 60% to 90%.

Examples of a method of forming the first electrode and the second electrode include a deposition method including a electron beam vapor deposition method, a heat filament vapor deposition method, a vacuum deposition method, a sputtering method, a chemical vapor deposition (CVD method), an MOCVD method, a combination of an ion plating method and an etching method; various printing methods such as a screen printing method, an inkjet printing method, and a metal mask printing method; a plating method (an electroplating method or an electroless plating method); a lift-off method; a laser ablation method; and a sol-gel method. According to various printing methods or plating methods, it is possible to directly form the first electrode and the second electrode having desired shapes (pattern). Further, after forming the organic layer, when the first electrode or the second electrode is formed, it is preferably formed particularly based on a film forming method such as a vacuum deposition method requesting less energy of film forming particles or a film forming method such as an MOCVD method, in that damage to the organic layer is prevented from being generated. If damage is generated to the organic layer, it is likely to generate a non-luminous pixel (or non-luminous sub-pixel) called a "dead pixel" caused by a leakage current. In addition, it is preferable to perform an operation from forming an organic layer to forming the electrodes without being exposed to the atmosphere in that the deterioration of the organic layer caused by moisture in the atmosphere is prevented. In some cases, either the first electrode or the second electrode may not be patterned.

In the light emitting apparatus of the present disclosure, and the like, a plurality of light emitting devices are formed on the first substrate. Here, examples of the first substrate or the second substrate include a high strain point glass substrate, a soda glass ($Na_2O.CaO.SiO_2$) substrate, a borosilicate glass ($Na_2O.B_2O_3.SiO_2$) substrate, a forsterite ($2MgO.SiO_2$) substrate, a lead glass ($Na_2O.PbO.SiO_2$) substrate, various glass substrates having an insulating layer formed on the surface thereof, a quartz substrate, a quartz substrate having an insulating layer formed on the surface thereof, a silicon substrate having an insulating layer formed on the surface thereof, and an organic polymer (a configuration of a high polymer material such as a plastic•film, a plastic•sheet, and a plastic substrate that have flexibility and are configured with a high polymer material) such as polymethyl methacrylate (PMMA) or polyvinyl alcohol (PVA), polyvinyl phenol (PVP), polyethersulfone (PES), polyimide, polycarbonate, and polyethylene-telephthalate (PET). The materials configuring the first substrate and the second substrate may be identical to or different from each other. However, the second substrate of the upper surface light emitting-type light emitting apparatus is asked to be transparent to light emitted by the light emitting device and the first substrate of the lower surface light emitting-type light emitting apparatus is asked to be transparent to light emitted by the light emitting device.

Examples of the light emitting apparatus of the present disclosure and the like include an organic electronic luminescence light emitting apparatus (simply referred to as an organic EL light emitting apparatus). If the organic EL light emitting apparatus is a color display organic EL light emitting apparatus, the sub-pixels are configured as described above by each of the organic EL devices included in the organic EL light emitting apparatus. Here, one pixel is configured with, for example, three sub-pixels of a red luminous sub-pixel that emits red light, a green luminous sub-pixel that emits green light, and a blue luminous sub-pixel that emits blue light as described above. Accordingly, in this case, if the number of the organic EL devices included in the organic EL light emitting apparatus is N×M, the number of the pixels is (N×M)/3. For example, the organic EL light emitting apparatus can be used as a monitoring apparatus configuring a personal computer, or as a monitoring apparatus included in a television receiver, a cellular phone, a Personal Digital Assistant (PDA), or game equipment. Otherwise, the organic EL light emitting apparatus can be applied to an electrical viewfinder (EVF) and a head mounted display (HMD). Otherwise, examples of the light emitting apparatus of the present disclosure and the like additionally include a lighting system including a backlight device of a liquid crystal display and a plane light source device.

The organic layer includes a light emitting layer (for example, a light emitting layer made with an organic light emitting material). Specifically, the organic layer may be configured in, for example, a layered structure of a hole transporting layer, a light emitting layer, and an electron transporting layer, a layered structure of a hole transporting layer and a light emitting layer also serving as an electron transporting layer, a layered structure of a hole injecting layer, a hole transporting layer, a light emitting layer, an electron transporting layer, and an electron injecting layer, or the like. In addition, if the layered structure is a "tandem unit", the organic layer may have a double tandem structure in which a first tandem unit, a connecting layer, and a second tandem unit are stacked, or may have a triple-or-higher tandem structure in which three or more tandem units are stacked. In this case, since the colors of emitted light are changed by each tandem unit of a red color, a green color, and a blue color, an organic layer that emits light of a white color as a whole can be obtained. Examples of a method of forming an organic layer include various coating methods such as a physical vapor deposition method (PVD method) such as a vacuum deposition method; a printing method such as a screen printing method and an ink jet printing method; and a laser transferring method in which a layered structure of a laser absorbing layer and an organic layer on a substrate for transfer is irradiated with a laser beam, the organic layer on the laser absorbing layer is separated, and the organic layer is transferred. If the organic layer is formed based on the vacuum deposition method, the organic layer can be obtained by using a so-called metal mask and by depositing a material that has passed through an opening provided in the metal mask, or the organic layer may be formed on the entire surface without patterning.

In the upper surface light emitting-type light emitting apparatus, the first electrode is provided, for example, on the interlayer insulating layer. Subsequently, the interlayer insulating layer covers a light emitting device driving unit formed on the first substrate. The light emitting device driving unit is configured with one or a plurality of thin film transistors (TFT), and the TFT and the first electrode are electrically connected to each other through a contact plug provided in the interlayer insulating layer. As a material configuring the interlayer insulating layer, $SiO_2$, BPSG, PSG, BSG, AsSG, PbSG, SiON, SOG (spin-on glass), an $SiO_2$-based material such as low-melting glass or glass paste; an SiN-based material; and an insulating resin such as a polyimide resin, a novolac resin, an acrylic resin, or polybenzoxazole, can be used alone or by appropriately being combined. Processes according to the related art such as a CVD method, a coating method, a sputtering method, and various printing methods can be used for forming the interlayer insulating layer. In the lower surface light emitting-type light emitting apparatus having configurations and structures in which light from the light emitting device passes through an interlayer insulating layer, the interlayer insulating layer is asked to be configured with a material transparent to the light from the light emitting device and the light emitting device driving unit is asked to be formed not to block the light from the light emitting device. In addition, in the lower surface light emitting-type light emitting apparatus, the light emitting device driving unit can be provided in the upper portion of the second electrode.

In order to achieve an object of preventing moisture from reaching the organic layer, an insulating or conductive protecting film is preferably provided in the upper portion of the organic layer as described above. The protecting film is preferably formed particularly based on a film forming method such as a vacuum deposition method requesting less energy of film forming particles or a film forming method such as a CVD method or an MOCVD method, in that an effect on the undercoat can be minimized. Otherwise, it is desirable to set a film forming temperature to be the room temperature in order to prevent a decrease in the brightness caused by the deterioration of the organic layer, and it is further desirable to form the protecting film in a condition in which the stress on the protecting film is minimized in order to prevent the protecting film from peeling off. In addition, it is preferable to form the protecting film without exposing previously formed electrodes to the atmosphere. According to this, the deterioration of the organic layer caused by moisture or oxygen in the atmosphere can be prevented. Further, if the light emitting apparatus is an upper surface light emitting type, the protecting film is preferably configured with a material that transmits light emitted by the organic layer, for example, by 80% or more. Specifically, examples of a material of the protecting film include an inorganic amorphous insulating material, for example, the material described above. Since such an inorganic amorphous insulating material does not generate grains, an excellent protecting film with low water permeability can be formed. Further, if the protecting film is configured with a conductive material, the protecting film may be configured with a transparent conductive material such as ITO or IZO.

EXAMPLE 1

Figure 12:
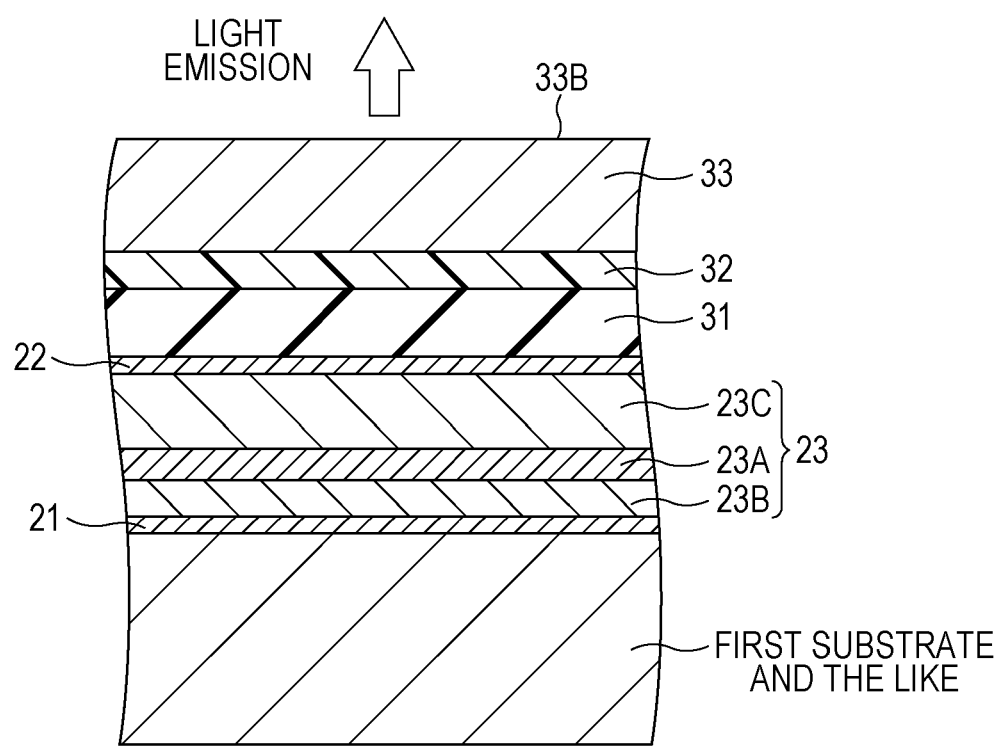
FIG. 12 is a schematic diagram of an organic layer and the like of a light emitting device that configures the light emitting apparatus according to Example 1.
Figure 13A:
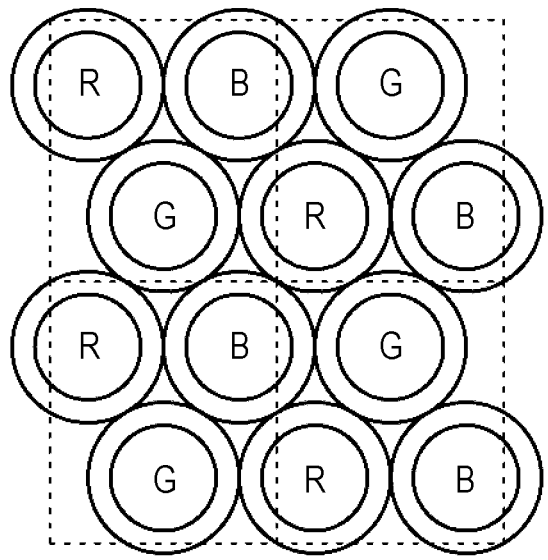
FIGS. 13A and 13B are schematic diagrams illustrating an array of sub-pixels in the light emitting apparatus according to Examples 1 to 10, respectively.

Example 1 relates to a light emitting apparatus of the present disclosure, specifically to an organic EL light emitting apparatus, and relates to a light emitting apparatus according to first and second embodiments of the present disclosure. FIG. 1 is a schematic partial cross-sectional view of a light emitting apparatus of Example 1 (hereinafter, it may be referred to as an organic EL light emitting apparatus). FIG. 12 is a schematic diagram of an organic layer and the like. FIG. 13A is a schematic diagram illustrating an array of sub-pixels. Further, FIG. 12 illustrates a single organic layer for the sake of simplifying the drawing, but in reality, a plurality of organic layers are stacked to form a multi-layer tandem structure.

Further, organic EL light emitting apparatuses according to Example 1 or Examples 2 to 8 and 10 to be described below are upper surface light emitting-type light emitting apparatuses. That is, light from each light emitting device 10 is emitted to the outside through a second electrode corresponding to an upper electrode and a second substrate 34. Meanwhile, the organic EL light emitting apparatus in Example 9 to be described below is a lower surface light emitting-type light emitting apparatus in which light from each light emitting device 10 is emitted to the outside through the first substrate 11.

As illustrated in FIGS. 1 to 10, the organic EL light emitting apparatus according to Example 1 or Examples 2 to 10 to be described below includes:

(A) a first substrate 11 on which a plurality of light emitting devices 10 each formed by stacking a first electrode 21, a light emitting unit 24 configured with an organic layer 23 including a light emitting layer 23A made with, for example, an organic light emitting material, and a second electrode 22 are formed; and (B) the second substrate 34 disposed opposite the first substrate 11, in which the first substrate 11 includes a first member 51 that diffuses light from each of the light emitting device 10 and emits the light to the outside, and a second member 52 provided between the first members 51, and light absorbing layers 54 are provided in the second members 52. Further, the first members 51 and the second members 52 including the light absorbing layers 54 may be collectively referred to as a "light reflecting layer 50".

Here, each of the light emitting device (organic EL device) 10 in the organic EL light emitting apparatuses according to Example 1, or Examples 2 to 10 to be described below more specifically includes:

(a) the first electrode 21;

(b) the second member 52 that has an opening 25 and exposes the first electrode 21 through the lower portion of the opening 25;

(c) the organic layer 23 including the light emitting layer 23A provided at least on a portion of the first electrode 21 exposed through the lower portion of the opening 25, and made with, for example, an organic light emitting material; and (d) the second electrode 22 that is formed on the organic layer 23. The organic layer 23 has a layered structure of, for example, a hole injecting and transporting layer 23B, the light emitting layer 23A, and an electron transporting layer 23C. In the drawings, the organic layer 23 may be illustrated as a single layer.

The organic EL light emitting apparatuses according to Example 1, or Examples 2 to 10 to be described below are high resolution light emitting apparatuses applied to an electrical viewfinder (EVF) or a head mounted display (HMD), or are, for example, large-sized organic EL light emitting apparatuses such as television receivers.

The organic EL light emitting apparatuses according to Example 1, or Examples 2 to 10 to be described below each have a plurality of light emitting devices (specifically, organic EL devices) 10. In particular, the number of pixels, for example, is 2048×1236, and one light emitting device 10 forms one sub-pixel, and the number of the light emitting devices (specifically, organic EL devices) 10 is three times the number of the pixels. Further, the organic EL light emitting apparatus is an active matrix-type color display.

One pixel is configured with three sub-pixels of a red luminous sub-pixel that emits red light, a green luminous sub-pixel that emits green light, and a blue luminous sub-pixel that emits blue light. Further, the second substrate 34 includes a color filter 33, the light emitting device 10 emits white light, and each color luminous sub-pixel is configured by combining the light emitting device 10 emitting white light with the color filter 33. The color filter 33 is configured with a region through which passed light becomes red, a region through which passed light becomes green, and a region through which passed light becomes blue. A light shielding film (black matrix) may be provided between the color filters 33. The light emitting device 10 and the first members 51 are in contact with each other. Specifically, the second electrode 22 and the first members 51 are directly in contact with each other.

Figure 13B:
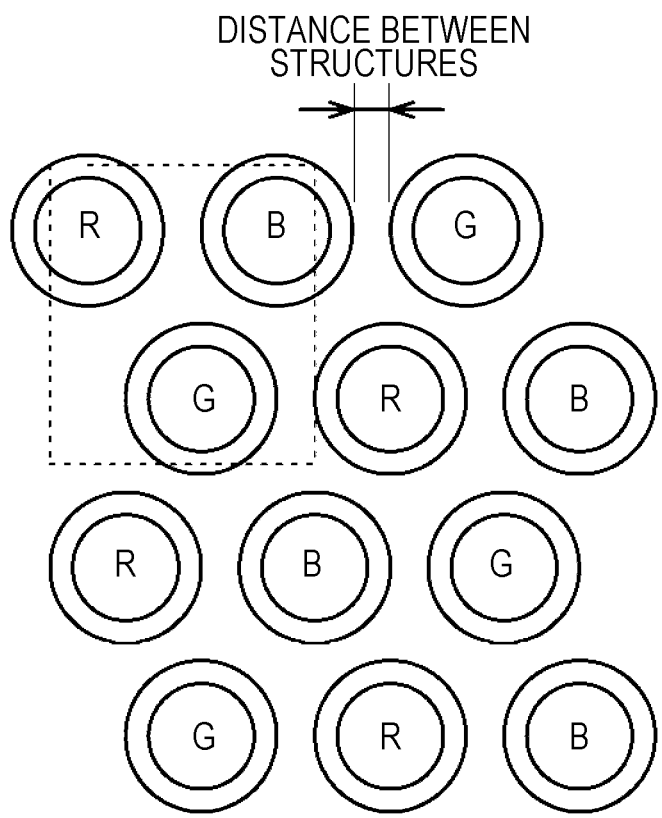

In the organic EL light emitting apparatuses according to Example 1, or Examples 2 to 10 to be described below, the array of sub-pixels is a pseudo delta array as illustrated in FIGS. 13A and 13B, and the size of one pixel enclosed by a dotted line is, for example, 5 μm×5 μm. Further, FIGS. 13A and 13B illustrate four pixels. In FIGS. 13A and 13B, the red luminous sub-pixel is denoted by "R", the green luminous sub-pixel is denoted by "G", and the blue luminous sub-pixel is denoted by "B". A distance between structures is 0 μm in the example illustrated in FIG. 13A, and a distance between structures is greater than 0 μm in the example illustrated in FIG. 13B.

Each of the light emitting devices according to Example 1, or Examples 2 to 10 to be described below has a triple tandem structure in which three tandem units are stacked, and the organic layer 23 in each tandem unit is specifically configured with a red light emitting organic layer, a green light emitting organic layer, and a blue light emitting organic layer. However, the structure is not limited thereto. Further, an average refractive index of the entire organic layer satisfies (real part, imaginary part)=(1.85, 0).

Specifically, the red light emitting organic layer is configured in order from the first electrode, with:

[Hole injecting layer] (thickness of 10 nm): LGHIL manufactured by LG Chem,

[Hole transporting layer] (thickness of 26 nm): HT320 manufactured by Idemitsu Kosan Co., Ltd.,

[Light emitting layer] (thickness of 50 nm): RH001 manufactured by Idemitsu Kosan Co., Ltd., and D125 (0.5% dope) manufactured by Toray Industries, Inc., and

[Electron transporting layer] (Thickness of 220 nm): ET085 manufactured by Idemitsu Kosan Co., Ltd.

Further, the green light emitting organic layer is configured in order from the first electrode, with:

[Hole injecting layer] (thickness of 10 nm): LGHIL manufactured by LG Chem,

[Hole transporting layer] (thickness of 35 nm): HT320 manufactured by Idemitsu Kosan Co., Ltd.,

[Light emitting layer] (thickness of 30 nm): BH232 manufactured by Idemitsu Kosan Co., Ltd., and GD206 (10% dope), and

[Electron transporting layer] (thickness of 175 nm): ETS085 manufactured by Idemitsu Kosan Co., Ltd.

Further, the blue light emitting organic layer is configured in order from the first electrode, with:

[Hole injecting layer] (thickness of 10 nm): LGHIL manufactured by LG Chem,

[Hole transporting layer] (thickness of 24 nm): HT320 manufactured by Idemitsu Kosan Co., Ltd.,

[Light emitting layer] (thickness of 30 nm): BH232 manufactured by Idemitsu Kosan Co., Ltd., and BD218 (10% dope), and

[Electron transporting layer] (thickness of 141 nm): ET085 manufactured by Idemitsu Kosan Co., Ltd.

The organic EL light emitting apparatuses according to Example 1, or Examples 2 to 8 and 10 to be described below uses the first electrode 21 as an anode electrode, and the second electrode 22 as a cathode electrode. The first electrode 21 is made with a light reflecting material, specifically, an Al—Nd alloy, and the second electrode 22 is made with a translucent material, specifically, a conductive material including magnesium (Mg), and more specifically an Mg—Ag alloy with a thickness of 10 nm. The first electrode 21 is formed based on a combination of a vacuum deposition method and an etching method. Further, the second electrode 22 is formed by a film forming method requesting less energy of film forming particles, such as a vacuum deposition method, specifically, and patterning is not performed thereon. The measurement results of light reflectivity of the first electrode 21, and the refractive index and the light transmittance of the second electrode 22 are as presented in Table 1 below.

Table 1
Refractive index of first electrode 21
Real part: 0.755
Imaginary part: 5.466
Refractive index of second electrode 22
Real part: 0.617
Imaginary part: 3.904
Light reflectivity of first electrode 21: 85
Light transmittance of second electrode 22: 57%

In the organic EL light emitting apparatuses according to Example 1, or Examples 2 to 8 and 10 to be described below, the first electrode 21 that configures an organic EL device is provided in an interlayer insulating layer 16 (more specifically, an upper interlayer insulating layer 16B) made with SiON formed based on a CVD method. Then, the interlayer insulating layer 16 covers an organic EL device driving unit formed on the first substrate 11. The organic EL device driving units are configured with a plurality of TFTs, and the TFTs and the first electrodes 21 are electrically connected to each other through contact plugs 18, wires 17, contact plugs 17A provided in an interlayer insulating layer (more specifically, the upper interlayer insulating layer 16B). Further, in the drawings, one TFT is illustrated for one organic EL device driving unit. The TFT includes gate electrodes 12 that are formed on the first substrate 11, a gate insulating film 13 that is formed on the first substrate 11 and the gate electrodes 12, source/drain regions 14 that are formed in the semiconductor layer formed on the gate insulating film 13, and channel forming regions 15 that are formed between the source/drain regions 14, and correspond to parts of the semiconductor layer positioned on the gate electrodes 12. Further, in the example illustrated in the drawings, the TFT is a bottom gate type, but the TFT may be a top gate type. The gate electrodes 12 of the TFT are connected to a scanning circuit (not illustrated).

In the organic EL light emitting apparatuses according to Example 1, or Examples 2 to 8 and 10 to be described below, the first substrate 11 is configured with a silicon substrate, and the second substrate 34 is configured with non-alkali glass or quartz glass. Meanwhile, in Example 9 to be described below, the first substrate 11 and the second substrate 34 are configured with non-alkali glass or quartz glass.

In the organic EL light emitting apparatuses according to Example 1, or Examples 2 to 10 to be described below, at least a portion of light diffused in the first members 51 is reflected at an interface between the first members 51 and the second members 52.

Further, in the organic EL light emitting apparatus according to Example 1, light reflecting films (light reflecting portion) 71 are formed on the interface between the first members 51 and the second members 52. The light reflecting films 71 are made with Al—Nd, specifically, and formed on inclined side walls of the second members 52. In the organic EL light emitting apparatus of Example 1, at least a portion (all in Example 1) of light diffused in the first members 51 is reflected on the surface of the light reflecting films 71.

In the organic EL light emitting apparatus of Example 1, the light absorbing layers 54 are provided in the second members 52, but specifically, the second member 52 is configured by stacking the light absorbing layer 54 and a second member configuring layer 53. In particular, the light absorbing layers 54 are provided in the lower portion of the second members 52. That is, the organic EL light emitting apparatus is configured by stacking the second members 52 and the second member configuring layers 53, from the first substrate.

In the organic EL light emitting apparatuses according to Example 1, or Examples 2 to 4 and 6 to 10 to be described below, the first members 51 having a truncated cone shape are made with silicon nitride ($Si_{1-x}N_x$), the second member configuring layers 53 that configure the second members 52 are made with $SiO_2$, and the light absorbing layers 54 are made with an acrylic resin including carbon black. Refractive indexes $n_1$ of a material configuring the first members 51, average refractive indexes $n_{2-ave}$ of a material configuring the second members 52 that includes the light absorbing layers 54, refractive indexes $n_2$ of a material configuring the second member configuring layers 53, and refractive indexes $n_2'$ of a material configuring the light absorbing layer are presented in Table 2 described below.

Further, in the organic EL light emitting apparatus, according to Example 1, or Examples 2 to 9 to be described below, a protecting film 31 and a sealing material layer 32 are further provided in the light reflecting layer 50 (on the first members 51 and the second members 52). Though refractive indexes $n_3$ of the protecting film 31 made with $Si_{1-y}N_y$, and refractive indexes $n_4$ of the sealing material layer 32 made with an epoxy resin are presented in Table 2, the indexes satisfies $|n_3-n_4|\le 0.3$. The protecting film 31 is formed based on a plasma CVD method in order to prevent the moisture from reaching the organic layer 23. Further, the first members 51 and the protecting film 31 may be formed at the same time, and the first members 51 and the protecting film 31 may be integrally configured. Further, FIG. 1 is illustrated so that the top surface of the first members 51 and the top surface of the second electrode 22 on the second members 52 have the same level, but the first members 51 may cover the second electrode 22 on the top surface of the second members 52. That is, the first members 51 may cover the entire surface.

TABLE 2

| | Real part | Imaginary part |
| --- | --- | --- |
| $n_1$ | 1.81 | 0 |
| $n_{2-ave}$ | 1.48 | 0 |
| $n_2$ | 1.46 | 0 |
| $n_2'$ | 1.54 | 0 |
| $n_3$ | 1.81 | 0 |
| $n_4$ | 1.65 | 0 |

Hereinafter, an overview of a method of manufacturing an organic EL light emitting apparatus according to Example 1 is described with reference to FIGS. 15A, 15B, 15C, 16A, 16B, and 17, and the organic EL light emitting apparatus according to Example 1 can be manufactured based on each step of:

forming an interlayer insulating layer on the first substrate 11 and forming the first electrodes 21 on the interlayer insulating layer;

obtaining the second members 52 with the openings 25 having inclined planes by forming a second member forming layer on the first electrodes 21 and the interlayer insulating layer and then selectively removing the second member forming layer on the first electrodes 21;

forming the light emitting unit 24 and the second electrode 22 that extend to the inclined planes of the openings 25 from the first electrodes 21 exposed through the lower portion of the openings 25, and then forming the light reflecting films 71 on the inclined planes of the openings 25; and forming the first members 51 on the second electrode 22.

Step 100

First, TFTs are manufactured for each sub-pixel on the first substrate 11 by a method according to the related art. The TFTs are configured with the gate electrodes 12 that are formed on the first substrate 11, the gate insulating film 13 that is formed on the first substrate 11 and the gate electrodes 12, the source/drain regions 14 that are formed in the semiconductor layer formed on the gate insulating film 13, and the channel forming regions 15 that are formed between the source/drain regions 14, and correspond to portions of the semiconductor layer positioned on the gate electrodes 12. Further, in the example illustrated in the drawings, the TFT is a bottom gate type, but the TFT may be a top gate type. The gate electrodes 12 of the TFT are connected to a scanning circuit (not illustrated). Subsequently, the lower interlayer insulating layer 16A made with $SiO_2$ is formed by a CVD method so as to cover the TFT, on the first substrate 11, and then the openings 16' are formed in the lower interlayer insulating layer 16A based on a photolithography technique and an etching technique (see FIG. 15A).

Step 110

Subsequently, the wires 17 made with aluminum are formed on the lower interlayer insulating layer 16A based on a combination of a vacuum deposition method and an etching method. Further, the wires 17 are electrically connected to the source/drain regions 14 of the TFTs through the contact plugs 17A provided in the openings 16'. The wires 17 are connected to signal supplying circuits (not illustrated). Then, the upper interlayer insulating layer 16B made with $SiO_2$ is formed on the entire surface by a CVD method. Subsequently, openings 18' are formed on the upper interlayer insulating layer 16B based on the photolithography technique and the etching technique (see FIG. 15B).

Step 120

Figure 15A:
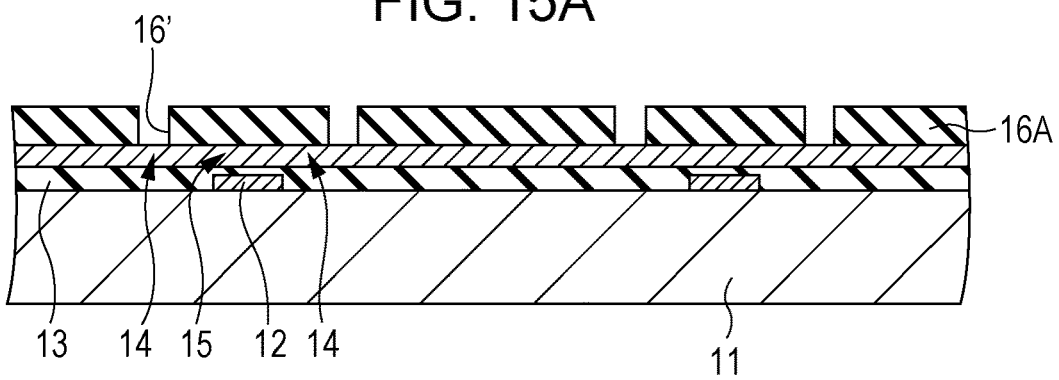
FIGS. 15A, 15B, and 15C are schematic partial cross-sectional views of a first substrate and the like for describing a method of manufacturing the light emitting apparatus according to Example 1.
Figure 15B:
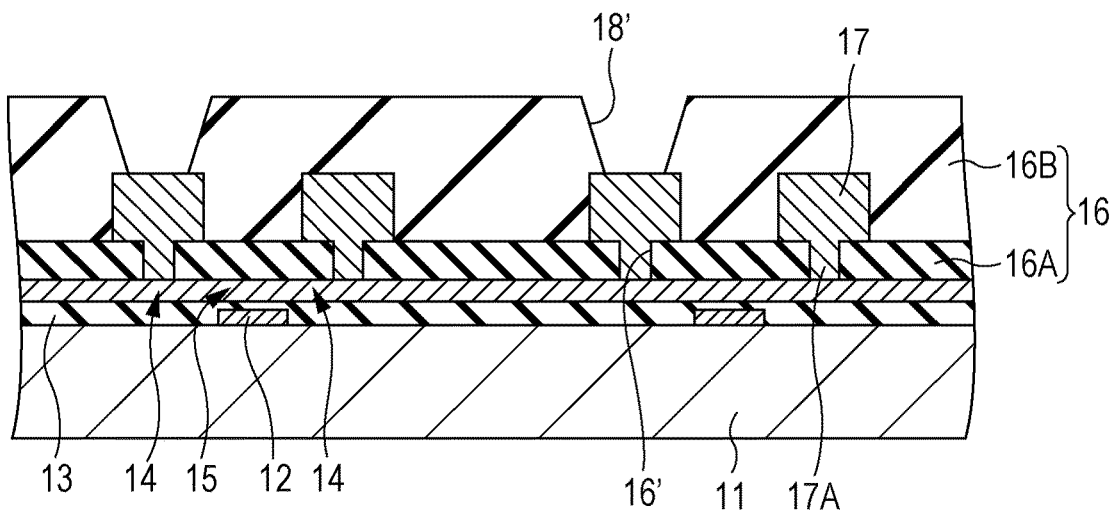
Figure 15C:
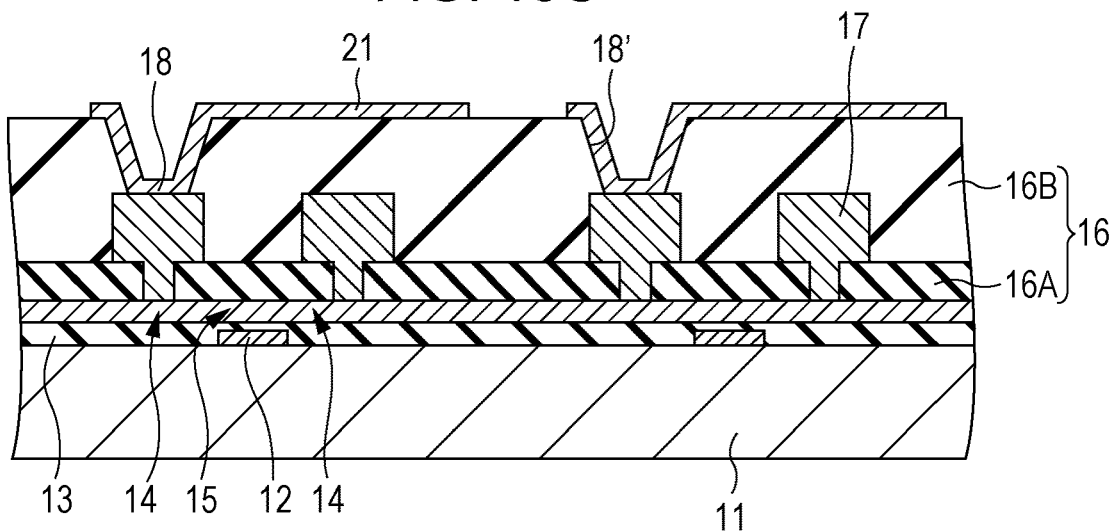
Figure 16A:
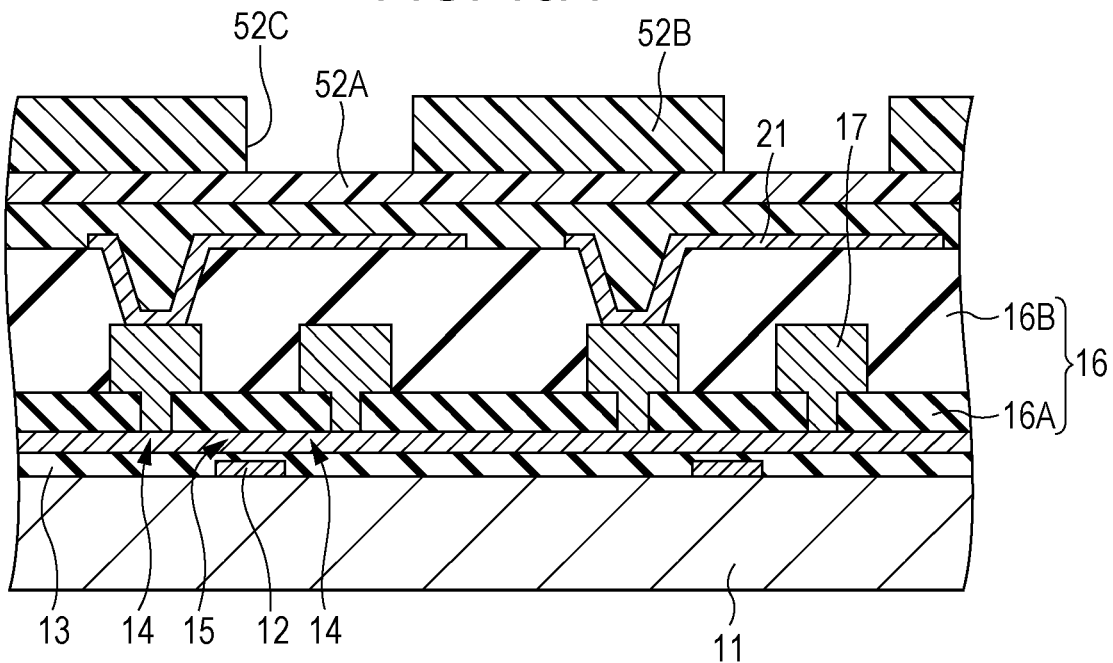
FIGS. 16A and 16B are schematic partial cross-sectional views of the first substrate and the like for describing a method of manufacturing the light emitting apparatus according to Example 1, subsequently to FIG. 15C.
Figure 16B:
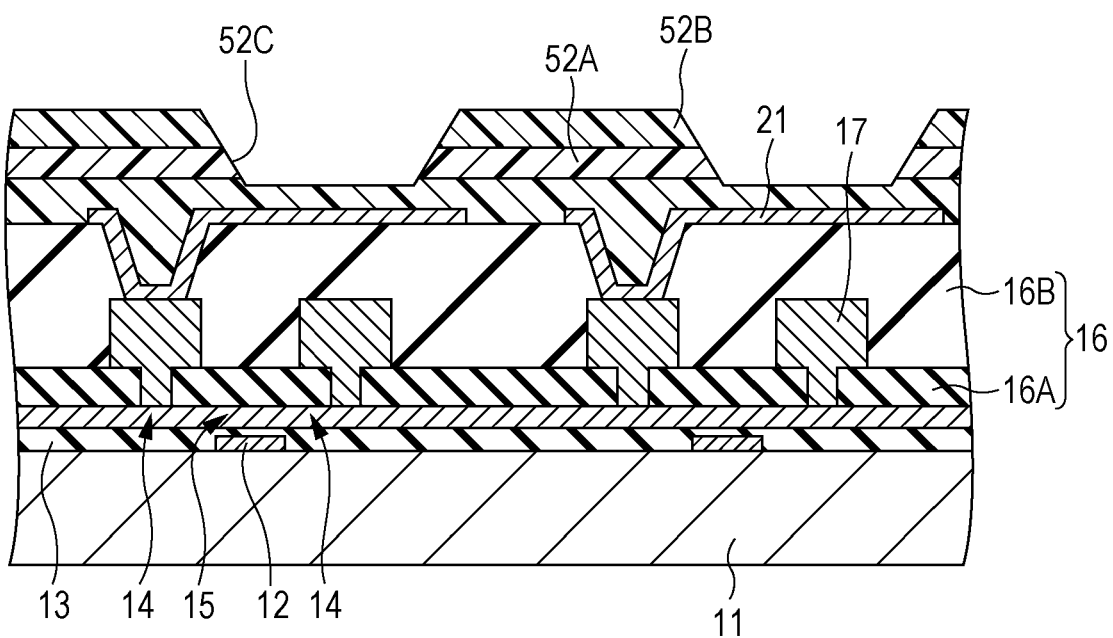

Thereafter, the first electrodes 21 made with an Al—Nd alloy are formed on the upper interlayer insulating layer 16B, based on a combination of the vacuum deposition method and the etching method (see FIG. 15C). Further, the first electrodes 21 are electrically connected to the wires 17 through the contact plugs 18 provided in the openings 18'.

Step 130

Figure 17:
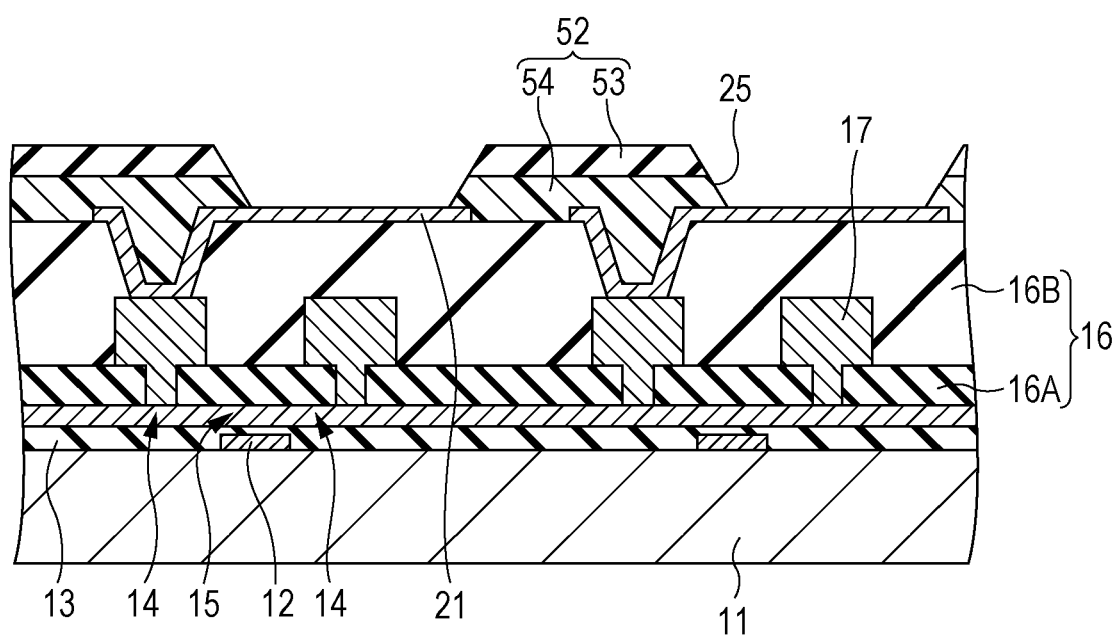
FIG. 17 is a schematic partial cross-sectional view of the first substrate and the like for describing a method of manufacturing the light emitting apparatus according to Example 1, subsequently to FIG. 16B.

Subsequently, the second members 52 that include the light absorbing layers 54 are formed. Specifically, a second member forming layer 52A (a layered structure of a $SiO_2$ layer that forms the second member configuring layers 53 and a resin layer that includes carbon black for forming the light absorbing layers 54) is formed on the entire surface and the resist material layer 52B is formed on the second member forming layer 52A. Subsequently, openings 52C are formed on the resist material layer 52B by exposing and developing the resist material layer 52B (see FIG. 16A). Thereafter, the second member forming layer 52A is formed into a tapered shape by etching the resist material layer 52B and the second member forming layer 52A based on the RIE method (see FIG. 16B), and finally the second members 52 with the openings 25 having inclined side walls (a layered structure of the second member configuring layers 53 and the light absorbing layers 54) can be obtained (see FIG. 17). The openings 25 have truncated cone shapes. Further, the second member forming layer 52A can be formed into a tapered shape by controlling the etching condition. However, the method of forming the second members 52 is not limited to the forming method described above, and, for example, the second members 52 as illustrated in FIG. 17 may be formed based on a photolithography technique and a wet etching technique after a second member forming layer made with an acrylic resin or a polyimide resin is formed on the entire surface.

Step 140

Subsequently, the organic layer 23 is formed on the second members 52 including the upper portion of the first electrodes 21 exposed through the lower portion of the openings 25 (that is, on the entire surface). Further, the organic layer 23 is obtained by sequentially stacking a hole injecting layer, a hole transporting layer, a light emitting layer, and an electron transporting layer, which are made with organic materials. The organic layer 23 can be obtained by performing vacuum deposition on organic materials on the basis of resistance heating.

Step 150

Thereafter, the second electrode 22 is formed on the entire surface of the display area. The second electrode 22 covers the entire surface of the organic layer 23 that configures N×M organic EL devices. The second electrode 22 insulates the first electrodes 21 by the second members 52 and the organic layer 23. The second electrode 22 is formed based on a vacuum deposition method which is a film forming method requesting less energy of film forming particles to a degree in which there is no influence on the organic layer 23. Further, since the second electrode 22 is formed in the same vacuum deposition apparatus in which the organic layer 23 is continuously formed without exposing the organic layer 23 to the atmosphere, the organic layer 23 is prevented from being deteriorated by the moisture or oxygen in the atmosphere. In particular, the second electrode 22 can be obtained by forming a Mg—Ag (volume ratio of 10:1) codepositing film with a thickness of 10 nm.

Step 160

Subsequently, the light reflecting films 71 made with Al—Nd can be formed on the inclined side walls of the second members 52 (specifically, on the second electrode 22), based on the sputtering method and the etching technique.

Step 170

Subsequently, the first members 51 made with silicon nitride ($Si_{1-x}N_x$) is formed on the entire surface (specifically, on the second electrode 22 and the light reflecting films 71), and the light reflecting layer 50 configured with the first members 51 and the second members 52 can be obtained by performing a planarizing process.

Step 180

Thereafter, the insulating protecting film 31 made with silicon nitride ($Si_{1-x}N_x$) is formed on the light reflecting layer 50 by a vacuum deposition method. Further, the first members 51 and the protecting film 31 may be formed at the same time, and the first members 51 and the protecting film 31 may be integrally formed. According to the configuration described above, a concave portion may be formed on the top surface of the protecting film 31 influenced by the openings 25, but light emitted from the light emitting device 10 can be effectively prevented from being diffused in the concave portion by regulating the value of |n₃−n₄| as described above.

Step 190

Subsequently, the second substrate 34 on which the color filter 33 is formed and the first substrate 11 on which the protecting film 31 is formed are attached using the sealing material layer 32. Finally, the organic EL light emitting apparatus can be completed by performing a connection with an external circuit.

In the method of manufacturing the organic EL light emitting apparatus according to Example 1 as described above, since the first members 51 can be directly formed on the second electrode 22, there is no loss in extracting light emitted from a light emitting device which is caused by the existence of an adhesive layer between the second electrode 22 and a reflector.

In the organic EL light emitting apparatus in Example 1, the first substrate includes first members (provided in a luminous region) that diffuse light from each light emitting device and emit the diffused light to the outside and second members (provided in the non-luminous region) provided between the first members. Since light absorbing layers are provided in the second members, light that enters the second members is absorbed by the light absorbing layers and it is difficult for the light to be emitted from the organic EL light emitting apparatus to the outside. Therefore, the contrast of the organic EL light emitting apparatus can be increased. Further, it is possible that light from each light emitting device is prevented from being totally reflected by the first members. That is, since the light emitting device and the first member are in contact with each other, specifically, the second electrode and the first member are directly in contact with each other, light from each light emitting device can be prevented from being totally reflected by the first members and light from each light emitting device can be extracted without a drastic loss.

EXAMPLE 2

Figure 2:
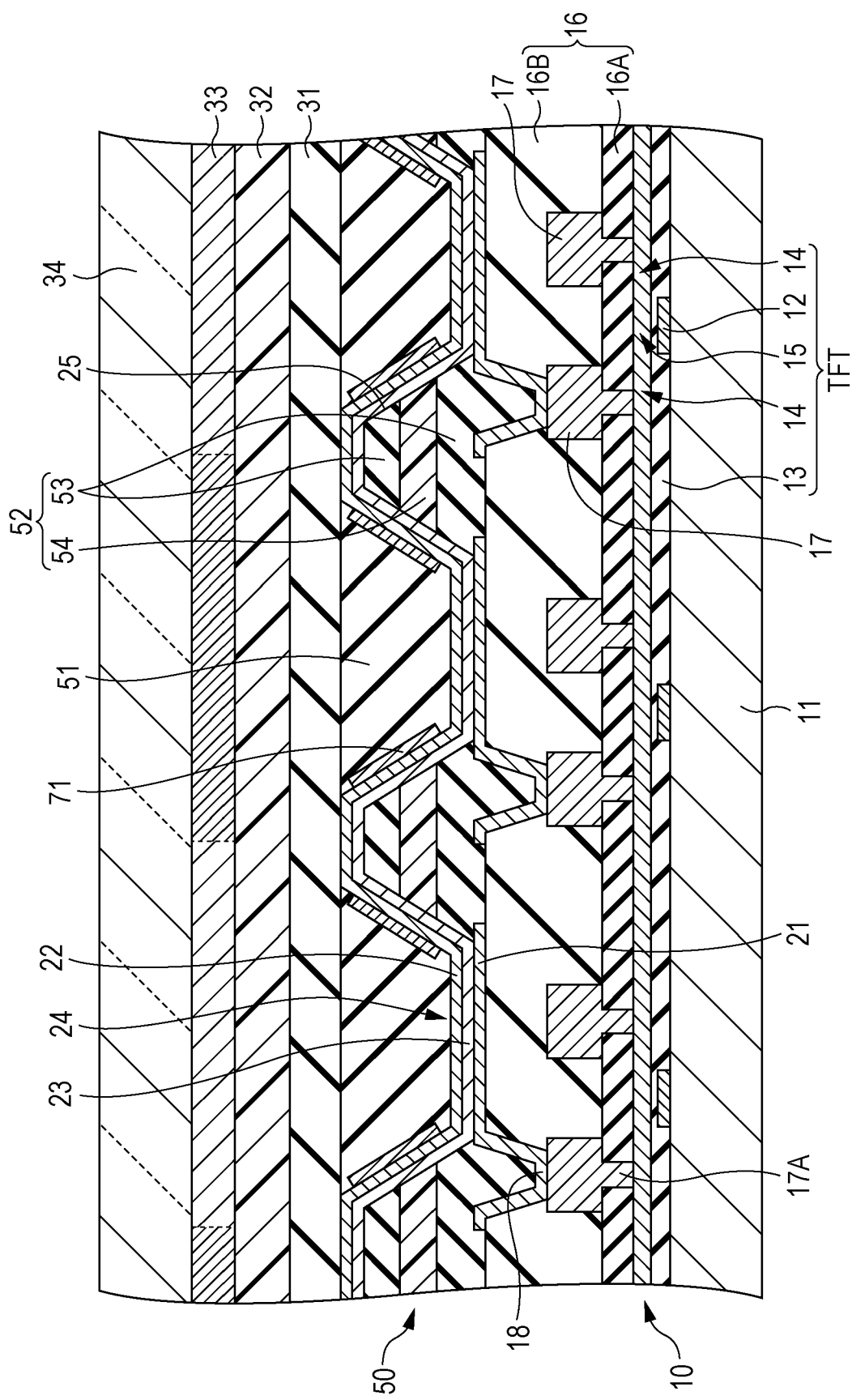
FIG. 2 is a schematic partial cross-sectional view of a light emitting apparatus according to Example 2.

Example 2 is a modification of Example 1. As FIG. 2 illustrates a schematic partial cross-sectional view of an organic EL light emitting apparatus according to Example 2, the light absorbing layers 54 are provided in the middle portions of the second members 52. That is, the organic EL light emitting apparatus has a structure obtained by stacking the second member configuring layers 53, the light absorbing layers 54, and the second member configuring layers 53 from the first substrate. Except for the configuration described above, since the organic EL light emitting apparatus according to Example 2 has the same configuration and structure as the organic EL light emitting apparatus according to Example 1, the detailed description thereof will be omitted.

EXAMPLE 3

Figure 3:
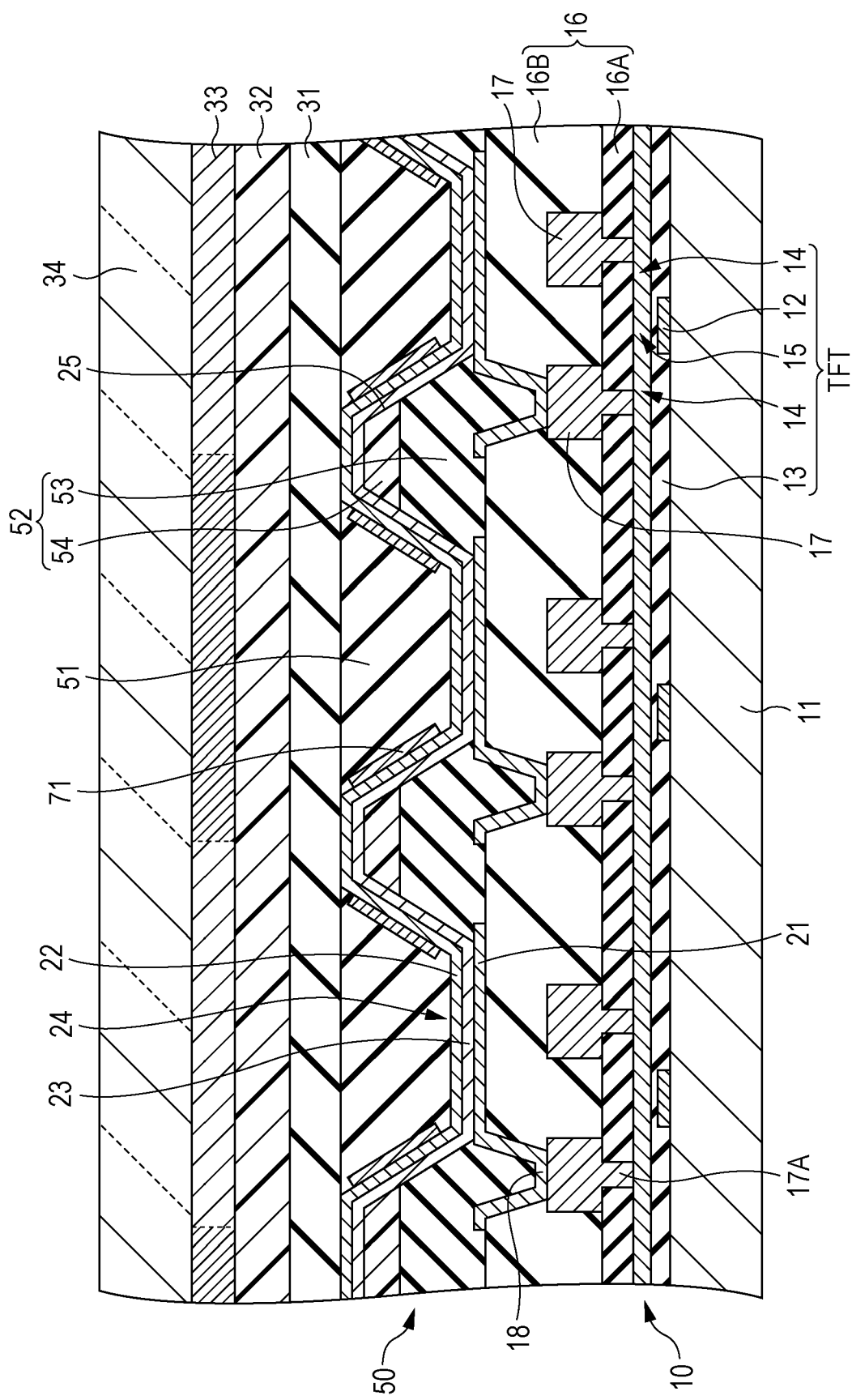
FIG. 3 is a schematic partial cross-sectional view of a light emitting apparatus according to Example 3.

Example 3 is a modification of Example 1. As FIG. 3 illustrates a schematic partial cross-sectional view of the organic EL light emitting apparatus according to Example 3, the light absorbing layers 54 are provided on the top portions of the second members 52. That is, the organic EL light emitting apparatus has a configuration obtained by stacking the second member configuring layers 53 and the second members 52 from the first substrate. Except for the configuration described above, since the organic EL light emitting apparatus according to Example 3 has the same configuration and structure as the organic EL light emitting apparatus according to Example 1, the detailed description thereof will be omitted.

EXAMPLE 4

Figure 4:
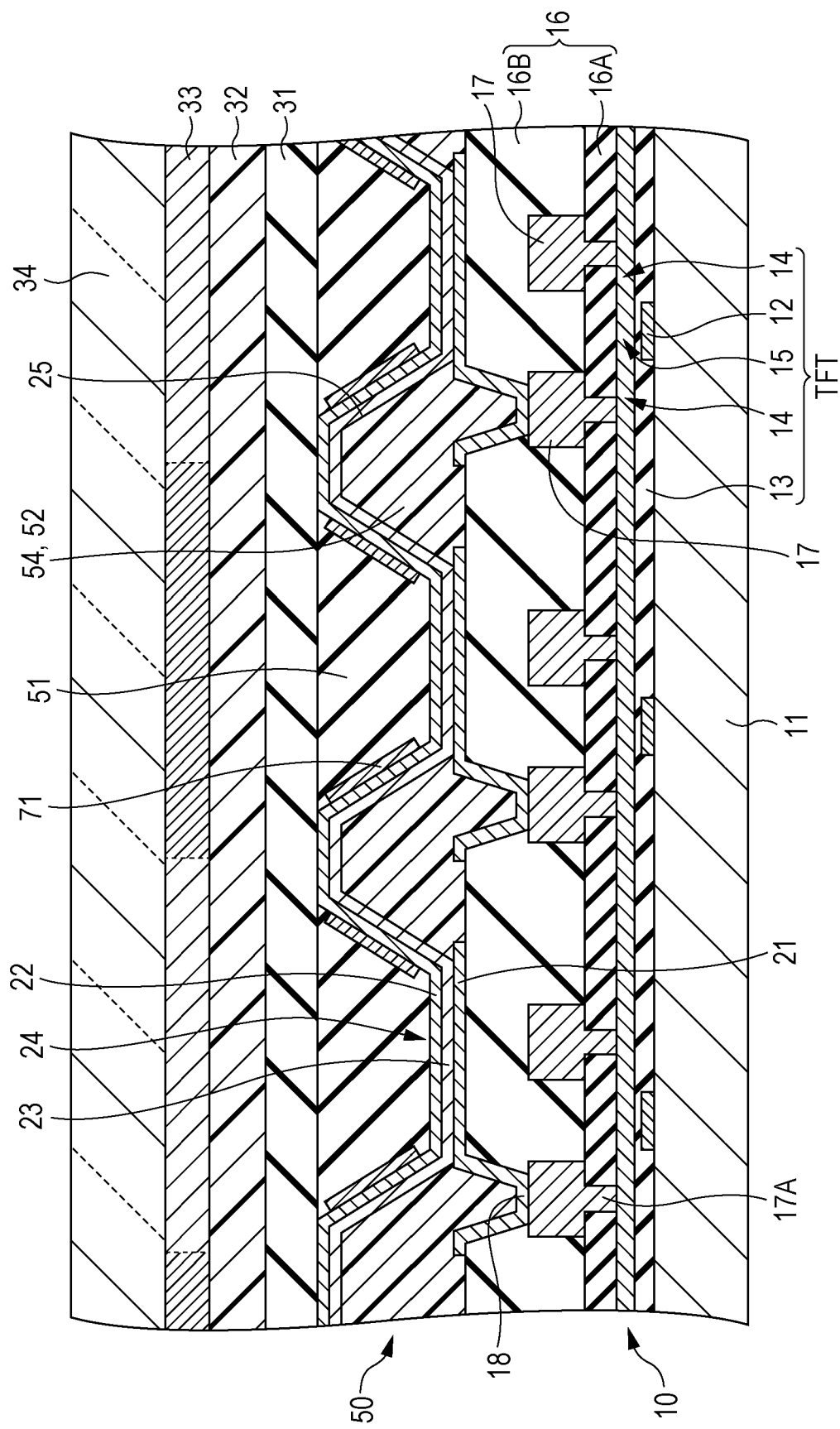
FIG. 4 is a schematic partial cross-sectional view of a light emitting apparatus according to Example 4.

Example 4 is also a modification of Example 1. As FIG. 4 illustrates a schematic partial cross-sectional view of the organic EL light emitting apparatus according to Example 4, the second members 52 are formed with the light absorbing layers 54. That is, the light absorbing layers 54 occupy the entire portion of the second members 52. Except for the configuration described above, since the organic EL light emitting apparatus according to Example 4 has the same configuration and structure as the organic EL light emitting apparatus according to Example 1, the detailed description thereof will be omitted.

EXAMPLE 5

Figure 5:
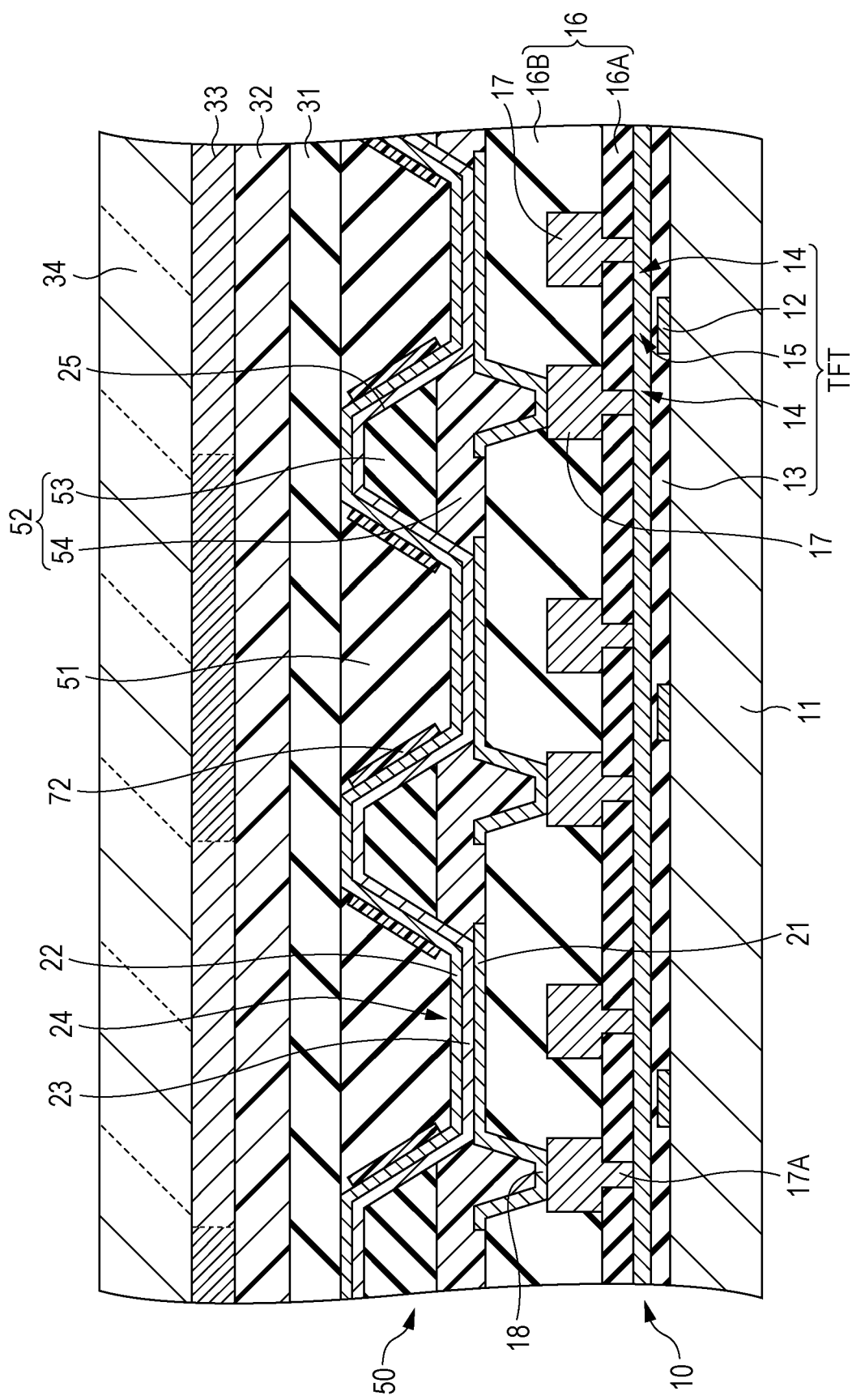
FIG. 5 is a schematic partial cross-sectional view of a light emitting apparatus according to Example 5.

Example 5 is also a modification of Examples 1 to 4. In Examples 1 to 4, the light reflecting films 71 are made with Al—Nd. Meanwhile, as FIG. 5 illustrates a schematic partial cross-sectional view of the organic EL light emitting apparatus according to Example 5, the light reflecting films (light reflecting portion) 72 is made with a resin. Here, the light reflecting films 72 in the organic EL light emitting apparatus according to Example 5 is made with a material having a refractive index $n_2''$ less than the refractive index $n_1$ of a material configuring the first members 51. The real parts of the refractive indexes $n_1$, $n_2$, $n_2'$, and $n_2''$ of materials that configure the first members 51, the second member configuring layers 53, the light absorbing layers 54, and the light reflecting films 72 according to Example 5 are presented in Table 3. Further, the values of the imaginary parts are "0". Further, $$n_1 - n_2'' \geq 0.2$$

is satisfied. The value of the average refractive index $n_{2\text{-}ave}$ is 1.58.

Table 3
Material configuring first members 51
Silicon nitride
(Refractive index $n_1$: 1.81)
Material configuring second member configuring layers 53 Acrylic resin
(Refractive index $n_2$: 1.54)
Material configuring light absorbing layers 54
Acrylic resin including carbon black
(Refractive index $n_2'$: 1.66/thickness: 1.7 μm)
Material configuring light reflecting films 72
Low refractive acrylic resin
(Refractive index $n_2''$: 1.40/Thickness: 3.0 μm)
Except for the configurations described above, since the organic EL light emitting apparatus according to Example 5 has the same configuration and structure as the organic EL light emitting apparatus according to Examples 1 to 4, the detailed description thereof will be omitted.

In Example 5, it is simulated that when external light of 1 watt enters the organic EL light emitting apparatus at an incidence angle $\theta_{in}$, the external light is absorbed by the light absorbing layers 54 and emitted from the organic EL light emitting apparatus. Additionally, an organic EL light emitting apparatus in which the light absorbing layers 54 are not provided is simulated as a comparative example in the same manner. In addition, light amount ratios of external light and absorptivities of external light are obtained. Further, comparative examples with respect to an organic EL light emitting apparatus in each embodiment provided with the light absorbing layers 54 are referred to as "corresponding comparative examples".

Light amount ratio of external light=(Amount of external light emitted from organic EL light emitting apparatus according to example)/(Amount of external light emitted from organic EL light emitting apparatus according to corresponding comparative example)

Further, simulation results according to respective cases in which the light absorbing layers 54 are provided in the middle portions of the second members 52 (Example 5E), the light absorbing layers 54 with (5/3) µm thickness are provided on the top portion of the second members 52 (Example 5F), the light absorbing layers 54 with 5/12 µm thickness are provided on the top portion of the second members 52 (Example 5G), and the second members 52 are configured with the light absorbing layers 54 (Example 5H) are presented in Table 4.

TABLE 4

| Example | Incidence angle $\theta_{in}$ | Refractive index $n_2$' of light absorbing layer | Inclination angle $\theta$ | Distance between structures | Light amount ratio of external light | Brightness efficiency |
| --- | --- | --- | --- | --- | --- | --- |
| 5A | 15° | 1.60 | 73° | 0 µm | 0.78 | 0.96 |
|    | 30° | Same as above | Same as above | Same as above | 0.57 | 0.96 |
| 5B | 15° | Same as above | 67° | Same as above | 0.78 | 0.99 |
| 5C | Same as above | 1.40 | 73° | Same as above | 0.81 | 1.00 |
| 5D | Same as above | 1.60 | Same as above | 4 µm | 0.12 | 0.90 |
| 5E | Same as above | Same as above | Same as above | 0 µm | 0.76 | |
| 5F | Same as above | Same as above | Same as above | 0 µm | 0.78 | |
| 5G | Same as above | Same as above | Same as above | 0 µm | 0.80 | |
| 5H | Same as above | Same as above | Same as above | 0 µm | 0.69 | |

External light absorptivity=1−Light amount ratio of external light

In order to simplify a simulation, the simulation is performed by replacing the entire portions of the protecting film 31 and the sealing material layer 32 with resin layers with refractive indexes of 1.60 and thicknesses of 3.0 µm. Further, inclination angles θ of inclined planes of the first members 51 in truncated cone shapes are set to be 73° in principle, and diameters of the openings on the top portions of the first members in truncated cone shapes are set to be 7.0 µm. Further, thicknesses of the entire portion of the second members 52 including the light absorbing layers 54 are set to be 5.0 µm, and the thickness of the light absorbing layers 54 are set to be (5/3) µm in principle, and distances between structures are set to be 0 µm in principle.

The simulation results when the incidence angle $\theta_{in}$=15° are presented in Table 4 below. Table 4 presents simulation results of brightness efficiency, in combination. Here, the brightness efficiency is a ratio of light energy extracted to the outside of the organic EL light emitting apparatus when the light energy of the light emitted from the light emitting layer is set to be "1", and the brightness efficiency is a value according to an example when brightness efficiency according to a corresponding comparative example is set to be "1".

Figure 20A:
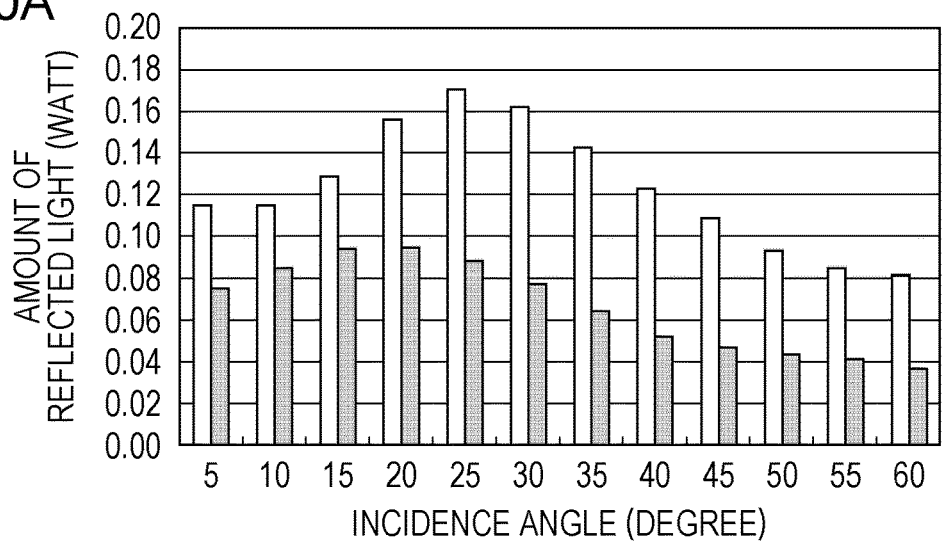
FIGS. 20A, 20B, and 20C are graphs illustrating simulation results of light amounts of reflective light, and reflectivity of external light and light amounts of reflective light in the light emitting apparatus according to Example 5.
Figure 20B:
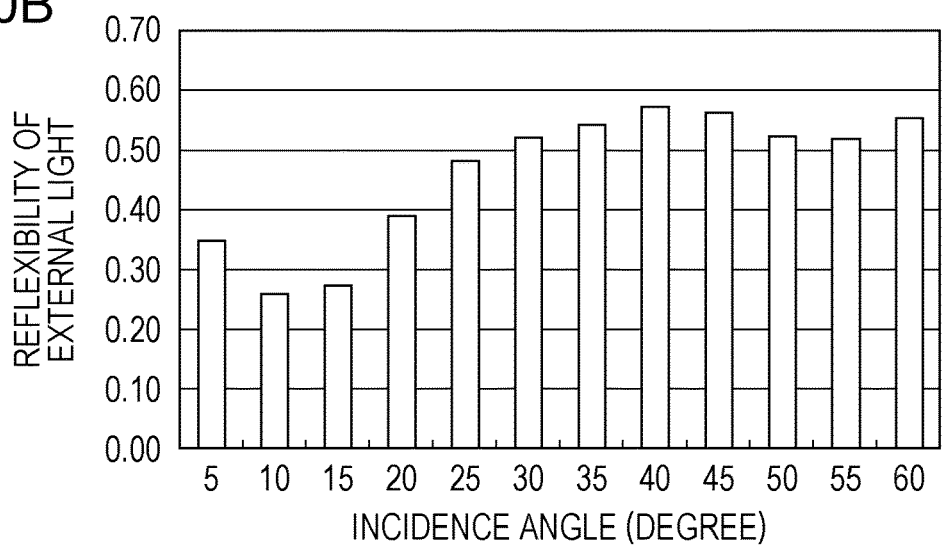
Figure 20C:
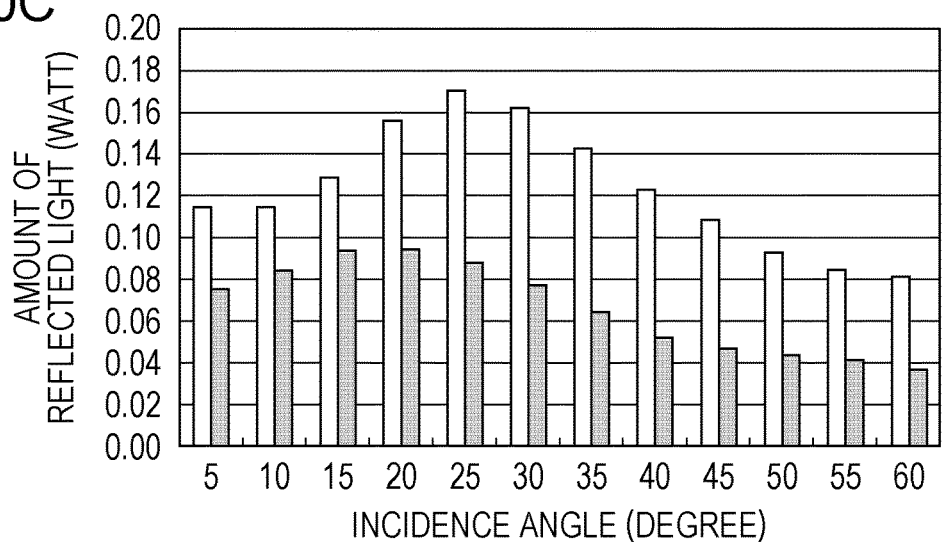

Further, a graph of results obtained by simulating light amount ratios of external light according to Example 5A and corresponding Comparative Example 5A corresponding to Example 5A is illustrated in FIG. 20A. In addition, results obtained by calculating absorptivities of the external light based on the results illustrated in FIG. 20A are illustrated in FIG. 20B. Further, simulation results when the light absorbing layers 54 are provided on the top portions of the second members 52 instead of providing the light absorbing layers 54 on the lower portions of the second members 52 are illustrated in FIG. 20C. Additionally, horizontal axes in FIGS. 20A, 20B, and 20C are incidence angles $\theta_{in}$ of external light, vertical axes in FIGS. 20A and 20C are light amounts of reflective light (unit: watt), and a vertical axis in FIG. 20B is reflectivity of external light. In addition, in FIGS. 20A and 20C, the results of the examples are indicated by black bars and the results of the corresponding comparative examples are indicated by white outlined bars.

From Table 4, it is found that values of light amount ratios of the external light are sufficiently decreased by providing the light absorbing layers 54. Further, it is found that dependence of the values of the light amount ratios of the external light on inclination angles θ of the inclined planes of the first members 51 in truncated cone shapes (see Example 5B) and on the refractive index $n_2$' of materials configuring the light absorbing layers 54 (see Example 5C) may not be recognized. Additionally, it is found that when the distances between structures are set to be from 0 µm to 4 µm (see Example 5D), areas of the second members 52 occupying non-luminous regions and also areas of the light absorbing layers 54 are increased so that values of light amount ratios of external light are drastically decreased. In addition, it is found that even if the light absorbing layers 54 are provided in the lower portions of the second members 52 (for example, see Example 5A), even if the light absorbing layers 54 are provided in the middle portions of the second members 52 (for example, see Example 5E), even if the light absorbing layers 54 are provided on the top portions of the second members 52 (for example, see Examples 5F and 5G), and even if the light absorbing layers 54 occupy the entire portions of the second members 52 (for example, see Example 5H), sufficient values of the light amount ratios of the external light can be obtained. Additionally, in Example 5A, even if the thicknesses of the light absorbing layers 54 are set to be (5/6) µm and (5/12) µm, respectively, the values of light amount ratios of external light in the same degree as Example 5A can be obtained.

Figure 21:
FIG. 21 is a graph illustrating a simulation result of a relationship between viewing angles and brightness in the light emitting apparatus according to Example 5.

Further, in some cases, the values of brightness efficiency are slightly decreased. This is because brightness with respect to a corresponding comparative example (see "B" in the graph) is slightly decreased at a viewing angle of approximately 20°, as indicated in simulation results (see "A" in the graph) on brightness with respect to viewing angles of FIG. 21. The slight decrease in the brightness is caused by slight absorption of light emitted from the light emitting layer by the light absorbing layers 54. However, the decrease in brightness efficiency in examples is not a value that causes problems, in practice.

EXAMPLE 6

Figure 6:
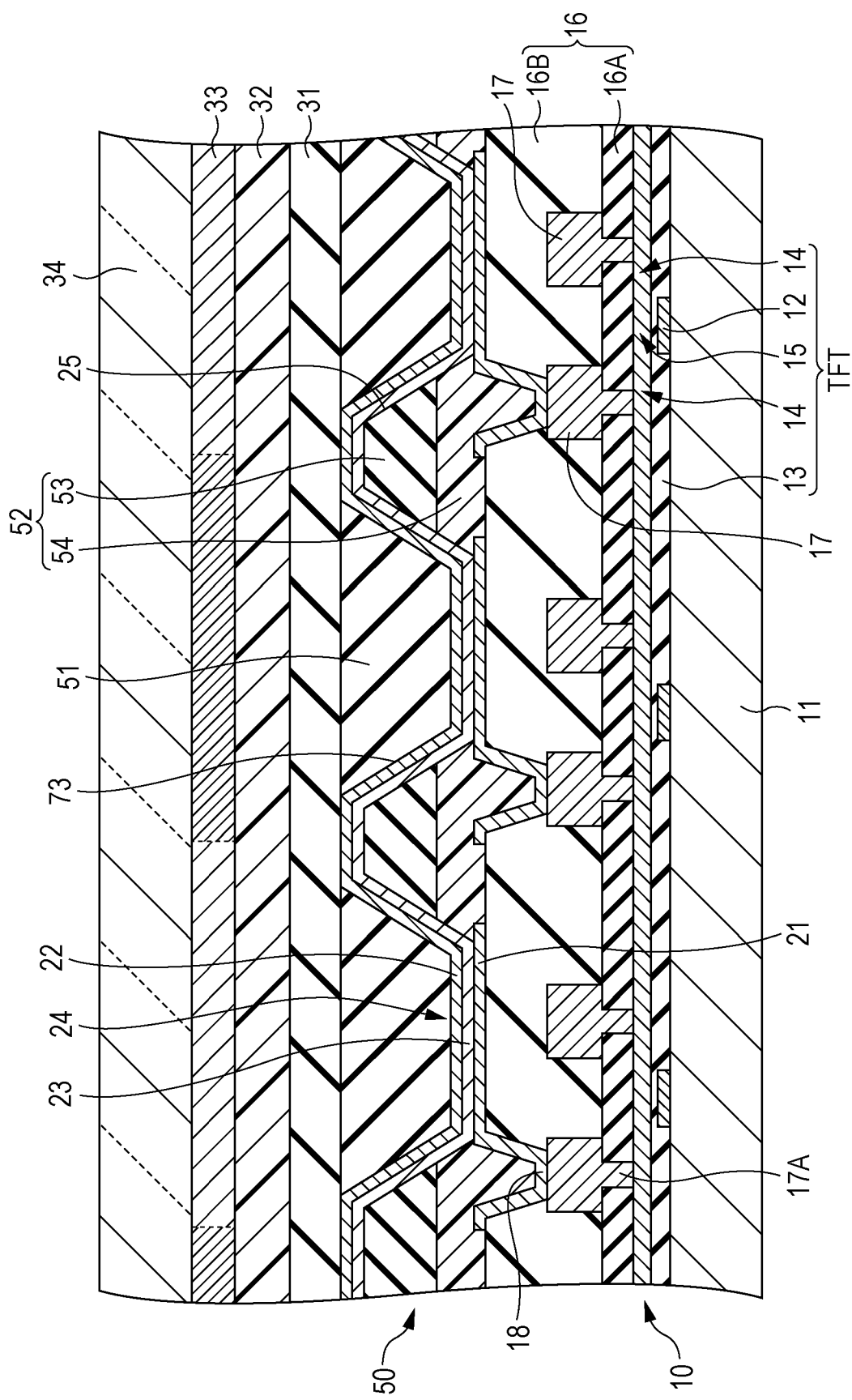
FIG. 6 is a schematic partial cross-sectional view of a light emitting apparatus according to Example 6.

Example 6 is also a modification of Examples 1 to 4, but relates to an organic EL light emitting apparatus according to the third embodiment of the present disclosure. As FIG. 6 illustrates a schematic partial cross-sectional view, the organic EL light emitting apparatus according to Example 6 is different from the organic EL light emitting apparatuses according to Examples 1 to 4, and the light reflecting films 71 are not formed. Instead of this, the refractive indexes $n_1$ of materials configuring the first members 51 and the average refractive indexes $n_{2\text{-}ave}$ of materials configuring the second members 52 including the light absorbing layers 54 satisfy $$1.1 \le n_1 \le 1.8$$

and preferably $$1.2 \le n_1 \le 1.6, \text{ and}$$

$$n_1 - n_{2\text{-}ave} \ge 0.2$$

and preferably $$n_1 - n_{2\text{-}ave} \ge 0.3.$$

Further, the refractive index $n_2$ of materials configuring the second members 52 except for the light absorbing layers 54 and the refractive index $n_2'$ of materials configuring the light absorbing layers 54 satisfy $$n_1 - n_2 \ge 0.2$$

and preferably $$n_1 - n_2 \ge 0.3, \text{ and}$$

$$n_1 - n_2' \ge 0.2$$

and preferably $$n_1 - n_2' \ge 0.3.$$

In the organic EL light emitting apparatus according to Example 6, at least a portion of light diffused in the first members 51 is reflected on surfaces of the second members 52 that face the first members 51 (that is, on the interfaces between the first members 51 and the second members 52). The surface of the second members 52 that face the first members 51 (or the interface between the first members 51 and the second members 52) is referred to as a light reflecting portion 73. Further, more specifically, since the organic layer 23 and the second electrode 22 are formed between the first members 51 and the second members 52, at least a portion of light diffused in the first members 51 is reflected on the interface between the second members 52 and the organic layer 23.

Examples of a material configuring the first members 51, a material configuring the second member configuring layers 53, and a material configuring the light absorbing layers 54 include the materials described in Example 1 or include the materials described in Example 5. Unlike in Examples 1 and 5, in Example 6, since the light reflecting films 71 and 72 are not formed, the manufacture process can be simplified.

Radiation angle distribution of brightness with respect to the organic EL light emitting apparatus according to Examples 1 and 6 is simulated. As a result, difference between the organic EL light emitting apparatus having configurations and structures according to Example 6 (when $n_1 - n_2 = 0.20$) and the organic EL light emitting apparatus of Example 1 in the radiation angle distribution of brightness is not recognized. In other words, it is found that, when $n_1 - n_2 \ge 0.20$, the organic EL light emitting apparatus according to Example 6 can obtain the same effect of increasing brightness as in the organic EL light emitting apparatus according to Example 1 in which the light reflecting films 71 are formed on the surface of the second members 52 that face the first members 51.

In the organic EL light emitting apparatus according to Example 6, since values of the refractive indexes $n_1$, and values of differences between the refractive indexes $n_1$ and average refractive indexes $n_{2\text{-}ave}$ are not regulated, the light extraction efficiency of light from the light emitting device 10 to the outside can be further increased without providing light reflecting members or the like on the interface between the first members 51 and the second members 52 (the light reflecting portion 73). In addition, the light from each light emitting device 10 can be prevented from being totally reflected by the first members 51. That is, since the light emitting device 10 and the first members 51 are in direct contact with each other, specifically, since the second electrode 22 and the first members 51 are in contact with each other, light from each light emitting device 10 can be prevented from being totally reflected by the first members 51 and the light from each light emitting device 10 can be emitted to the outside without a drastic loss.

The organic EL light emitting apparatus according to Example 6 can be manufactured by the same manufacturing method as the method of manufacturing the organic EL light emitting apparatus described in Example 1 (except for forming the light reflecting films 71, however).

Otherwise, the organic EL light emitting apparatus can be manufactured based on each step of:

preparing a stamper having a shape complementary to the first members 51;

applying a resin material on a supporting substrate;

obtaining a resin material layer having convex portions by removing the stamper after shaping the resin material by using the stamper;

planarizing the convex portions on a top portion of the resin material layer, and then embedding portions between the convex portions of the resin material layer with an adhesive agent layer; and removing the resin material layer from the supporting substrate, attaching the adhesive agent layer to the first substrate 11, and obtaining the second members 52 (including the light absorbing layers 54) made with the adhesive agent layer and the first members 51 made with the resin material layer. In this manner, the organic EL light emitting apparatus in which the light extraction efficiency of light from the light emitting device 10 to the outside can be further increased can be manufactured with a simple manufacturing method by obtaining the first members 51 made with the resin material layer and the second members 52 (including the light absorbing layers 54) made with the adhesive agent layer by using the stamper.

Hereinafter, such a manufacturing method, more specifically, a method of manufacturing the light reflecting layer 50, is described with reference to FIGS. 18A, 18B, 18C, and 18D.

Step 600

First, a stamper having a shape complementary to the first members 51 is prepared. In particular, a stamper (female mold) 60 having a shape complementary to the first members 51 is formed by using techniques according to the related art such as electroforming, etching, and other cutting processes.

Step 610

Meanwhile, the resin material is applied on a supporting substrate. Specifically, for example, an ultraviolet ray curable resin material 62 is applied (formed) on a supporting substrate 61 made with a glass substrate having optical transparency (see FIG. 18A).

Step 620

Subsequently, after shaping the resin material 62 by using the stamper 60, the stamper 60 is removed, so that a resin material layer 63 having convex portions 64 is obtained. Specifically, in a state in which the stamper 60 is pressed against the resin material 62, the resin material 62 is cured by radiating an energy ray (specifically, an ultraviolet ray) from the supporting substrate 61 side, and the resin material layer 63 is obtained (see FIG. 18B). Then the stamper 60 is removed. In this manner, the resin material layer 63 having the convex portions 64 can be obtained (see FIG. 18C). The convex portions 64 of the resin material layer 63 correspond to the first members 51.

Step 630

Figure 18A:
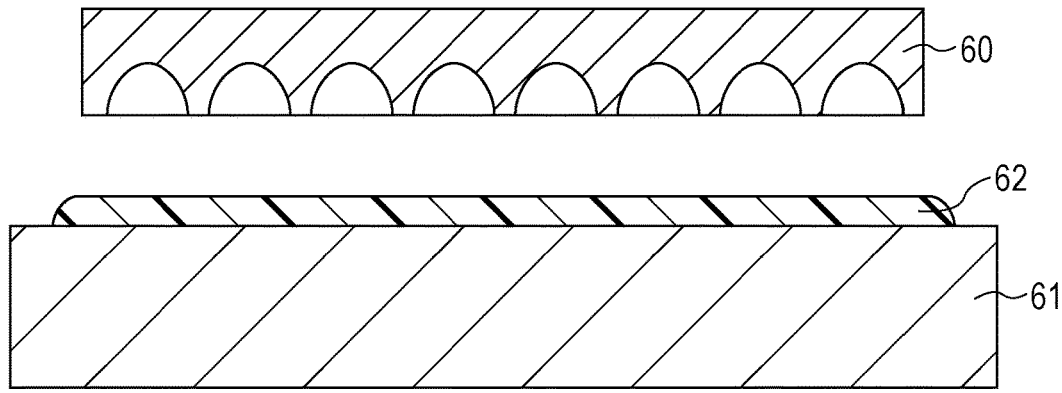
FIGS. 18A, 18B, 18C, and 18D are schematic partial cross-sectional views of a glass substrate and the like for describing an overview of another method of manufacturing the light emitting apparatus according to Example 6.
Figure 18B:
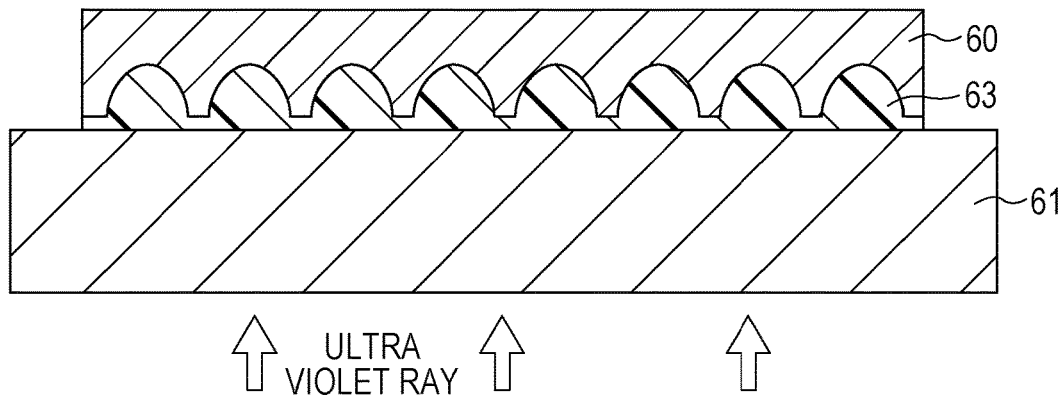
Figure 18C:
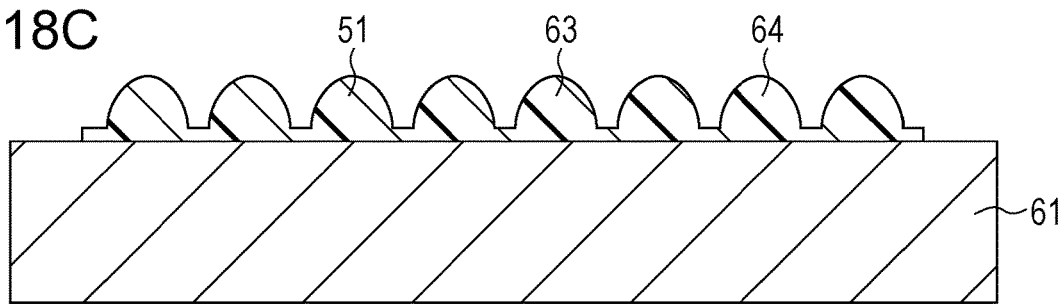
Figure 18D:
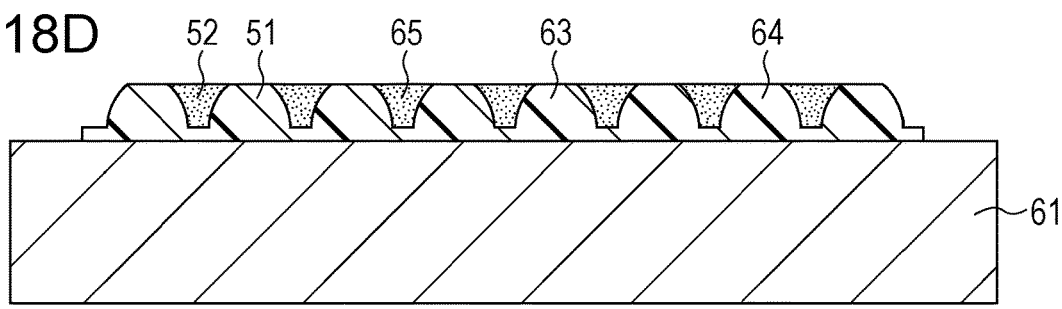
Figure 19A:
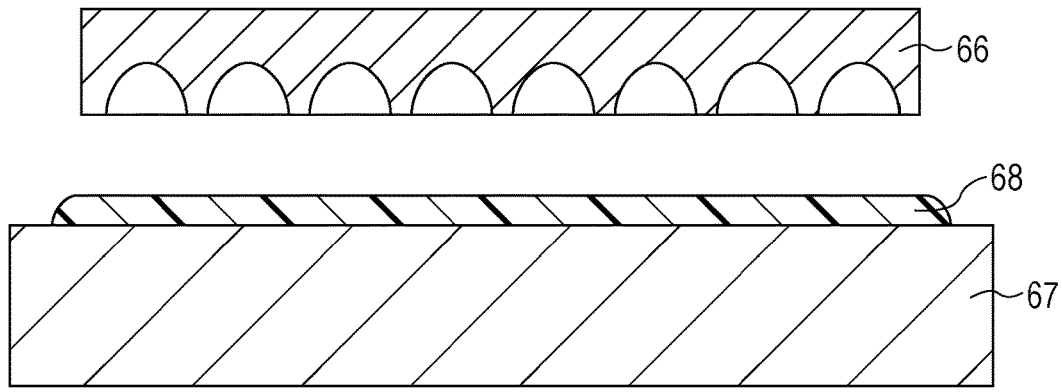
FIGS. 19A, 19B, 19C, and 19D are schematic partial cross-sectional views of a glass substrate and the like for describing an overview of another method of manufacturing the light emitting apparatus according to Example 10.
Figure 19B:
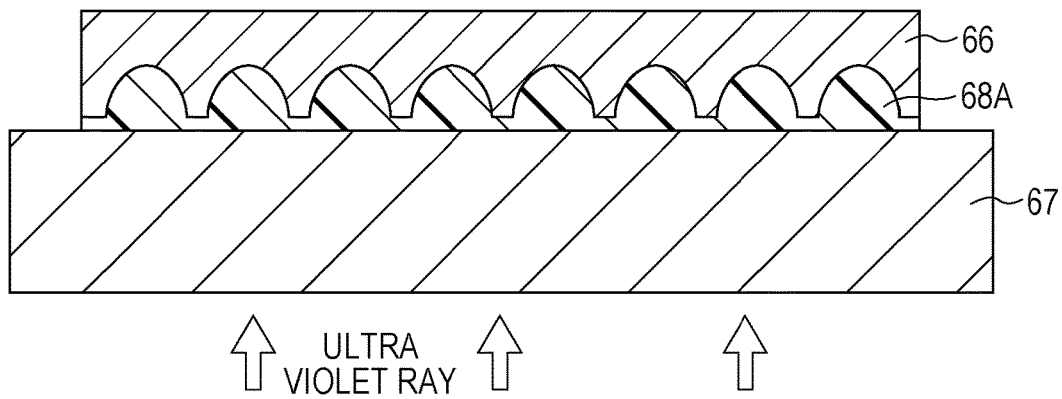
Figure 19C:
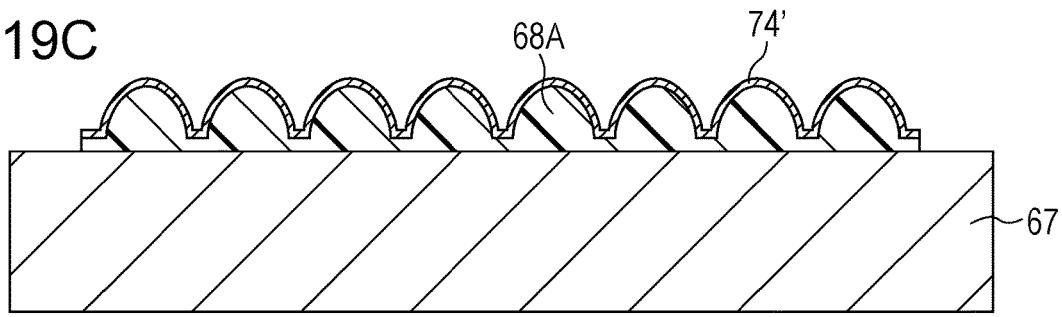
Figure 19D:
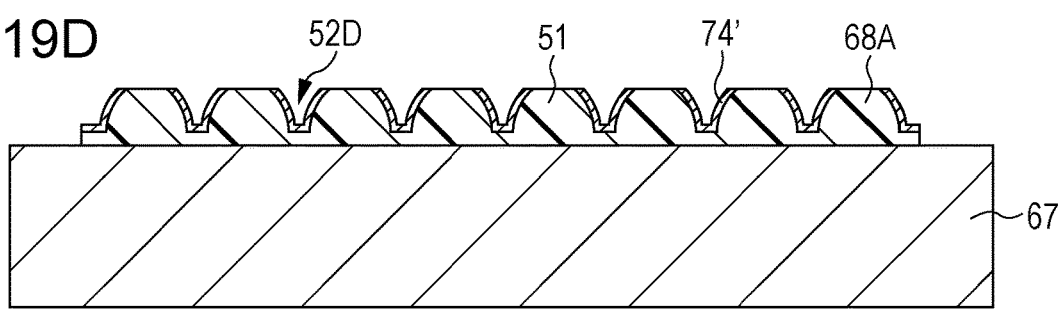

Thereafter, the top portion of the convex portions 64 of the resin material layer 63 is planarized, and then portions between the convex portions 64 of the resin material layer 63 are embedded in an adhesive agent layer 65 (see FIG. 18D). Further, the adhesive agent layer 65 has a layered structure of layers for forming the second member configuring layers 53 and layers for forming the light absorbing layers 54.

Step 640

Subsequently, the resin material layer 63 is removed from the supporting substrate 61, the resin material layer 63 is stacked on the first substrate 11 in which light emitting devices and the like are formed, that is, the adhesive agent layer 65 is disposed on the second electrode 22 so that the adhesive agent layer 65 does not prevent light from being emitted from the light emitting device 10, and the resin material layer 63 is attached through the adhesive agent layer 65. Further, subsequent to Steps 100 to 120, the first substrate 11 can be obtained by forming the organic layer 23 and forming the second electrode 22 on the first electrodes 21 and the upper interlayer insulating layer 16B in the same manner as in Steps 140 to 150. In this manner, it is possible to obtain the light reflecting layer 50 that is configured with the second members 52 that are formed with the adhesive agent layer 65 and include the light absorbing layers 54 and the first members 51 formed with the resin material layer 63.

Step 650

Thereafter, the insulating protecting film 31 is formed on the light reflecting layer 50 based on a plasma CVD method. Then, the second substrate 34 in which the color filter 33 is formed and the first substrate 11 in which the protecting film 31 is formed are attached using the sealing material layer 32. Finally, the organic EL light emitting apparatus can be completed by connecting the result to an external circuit. Further, thermosetting resin material or thermoplastic resin can be used instead of the ultraviolet ray curable resin material 62.

The first members 51 have truncated cone shapes (or a truncated rotating body shape) and can be configured so that the values described below are as presented in Table 5, and satisfy $0.5 \leq R_1/R_2 \leq 0.8$ and $0.5 \leq H/R_1 \leq 2.0$, when the diameter of a light incident surface (a surface that faces the first substrate 11 in Example 6) is $R_1$, the diameter of a light emitting surface (a surface that faces the second substrate 34 in Example 6) is $R_2$, and a height is H. Further, the inclined planes of the truncated cone shapes are linear. That is, the cross-sectional shape of the first member 51 when the first members 51 are cut through a virtual plane including axis lines of the first members 51 is a trapezoid.

TABLE 5

|  |  | Example | | | Comparative Example |
|---|---|---|---|---|---|
|  |  | 6 | 6A | 6B | 6B |
| $R_1$ | μm | 2.3 | 2.3 | 5.5 | Not formed |
| $R_2$ | μm | 3.8 | 3.8 | 9.4 |  |
| $R_1/R_2$ |  | 0.61 | 0.61 | 0.59 |  |
| H | μm | 1.5 | 1.5 | 5.0 |  |
| Inclination angle θ | Degree | 63 | 63 | 64 |  |
| Opening ratio |  | — | 0.385 | — | — |
| Diameter of light emitting unit $R_0$ | μm | — | 2.0 | 5.5 | 5.5 |
| Light emitting unit forming pitch | μm | — | 4.24 | 10 | 10 |
| Thickness of protecting film | μm | 3.0 | 3.0 | 3.0 | Not formed |
| Thickness of sealing material layer | μm | — | 2.0 | 10.0 |  |
| Thickness of adhesive layer | μm | Not formed | | | 3.5 |
| Thickness of color alter | μm | — | 2.0 | 2.0 | 2.0 |

Otherwise, in the modification example (Example 6A) of the organic EL light emitting apparatus according to Example 6, $R_1$, $R_2$, H, inclination angles θ of inclined planes of truncated cone-shaped first members, thicknesses of the protecting film 31, thicknesses of the sealing material layer 32, thicknesses of the color filter 33, diameters $R_0$ of the light emitting unit 24 (specifically, the diameter of the first electrodes 21), distances from the center of the light emitting unit 24 to the center of the neighboring light emitting unit 24 (light emitting unit forming pitch), and opening ratios in the organic EL light emitting apparatus having the configurations and structures of Example 6 are set as presented in Table 5. The organic EL light emitting apparatus according to Example 6A is, for example, a high resolution light emitting apparatus preferably applied to an electrical viewfinder (EVF) or a head mounted display (HMD). Further, an organic EL light emitting apparatus having the same configurations and structures as in the organic EL light emitting apparatus according to Example 6A except for providing an $SiO_2$ layer instead of the light reflecting layer 50 is set to be Comparative Example 6A.

Subsequently, radiation angle distribution of brightness in the organic EL light emitting apparatus according to Example 6A and Comparative Example 6A, is simulated. As a result, when a radiation angle is within a range of ±10°, the organic EL light emitting apparatus according to Example 6A has a brightness efficiency two times or higher, and a density of driving current 0.4 times or less than in Comparative Example 6A. Further, if it is assumed that the color filter is deviated by 0.3 μm in the horizontal direction, the organic EL light emitting apparatus according to Example 6A has a brightness efficiency two times or higher and the density of driving current is 0.4 times or less than in Comparative Example 6A, and the color mixing ratio of approximately 1%. Further, if the light amount of the light from the center of the light emitting device 10 is "1", the light amount of the light emitted from the light emitting device 10 to the outside through the first members 51 and the second substrate 34 is "1.6" in the organic EL light emitting apparatus according to Example 6A.

Figure 14:
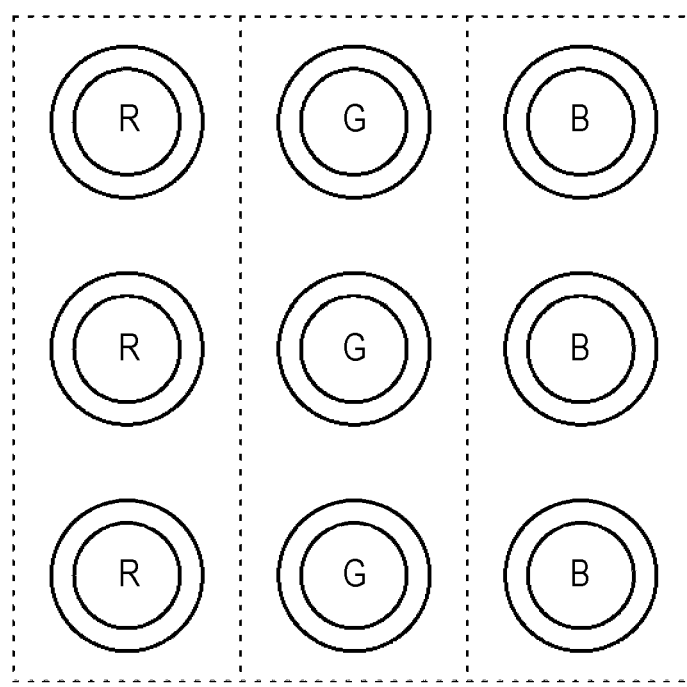
FIG. 14 is a schematic diagram illustrating an array of the sub-pixels in the light emitting apparatus according to Examples 1 to 10.

Otherwise, the organic EL light emitting apparatus according to Example 6B is a television receiver. The size of one sub-pixel according to Example 6B is larger than the size of one sub-pixel according to Example 6. Accordingly, if one sub-pixel is configured with one light emitting device 10, a thickness of the light reflecting layer 50 necessarily becomes large. Therefore, in Example 6B, a plurality of (specifically, 64) light emitting devices 10 are collected to configure one sub-pixel. Further, the size of one light emitting device 10 is, for example, 10 μm×10 μm, and $0.5 \leq R_1/R_2 \leq 0.8$ and $0.5 \leq H/R_1 \leq 2.0$ are satisfied. The inclined plane of the truncated cone shape is linear. Further, as illustrated in FIG. 14, the array of the sub-pixels is a stripe array. Further, in order to simplify the drawings, FIG. 14 is illustrated so that one sub-pixel is configured with an aggregation of three light emitting devices 10.

In the organic EL light emitting apparatus of Example 6B, $R_1$, $R_2$, H, the inclination angle θ of the inclined plane of the truncated cone-shaped first member, the thickness of the protecting film 31, the thickness of the sealing material layer 32, the thickness of the color filter 33, the diameter $R_0$ of the light emitting unit 24 (specifically, the diameter of the first electrode 21), and the like in the organic EL light emitting apparatus having basically the same configurations and structures as in Example 6 are set, as presented in Table 5. In the organic EL light emitting apparatus of Example 3, the second electrode 22 and the first members 51 are directly in contact with each other. Further, an organic EL light emitting apparatus having the same configurations and structures as in the organic EL light emitting apparatus according to Example 6B except that an $SiO_2$ layer is provided instead of the light reflecting layer 50, and adhesive layers are provided instead of the protecting film 31 and the sealing material layer 32 is set to be Comparative Example 6B.

Subsequently, an organic EL light emitting apparatus according to Example 6B and an organic EL light emitting apparatus according to Comparative Example 6B are simulated to obtain front surface brightness, light extraction efficiency, and brightness ratios to the front surface brightness at a viewing angle of 45° and a viewing angle of 60°. As a result, in Example 6B, the front surface brightness and the light extraction efficiency are increased to be two times or greater than in Comparative Example 6B. Further, radiation angle distribution of brightness in Example 6B and Comparative Example 6B is simulated. When brightness at a viewing angle of 0° according to Comparative Example 6B is set to be "1", the brightness ratio of a viewing angle of 45° to front surface brightness is 0.87, the brightness ratio of a viewing angle of 60° to front surface brightness is 0.79, and these are extremely high values.

Since the second electrode 22 and the first members 51 are directly in contact with each other in the organic EL light emitting apparatus according to Example 6B, light emitted from the light emitting device 10 is not drastically lost and particularly excellent characteristics can be obtained. Further, the organic EL light emitting apparatus according to Example 6B has not only a higher value of the front surface brightness but also a higher relative value of brightness at a high viewing angle than that of the organic EL light emitting apparatus according to Comparative Example 6B. That is, it is found that the organic EL light emitting apparatus according to Example 6B has high brightness at any angle from which the observer views the organic EL light emitting apparatus, and the organic EL light emitting apparatus according to Example 6B is an organic EL light emitting apparatus which is preferable as an organic EL light emitting apparatus for a television receiver.

EXAMPLE 7

Figure 7:
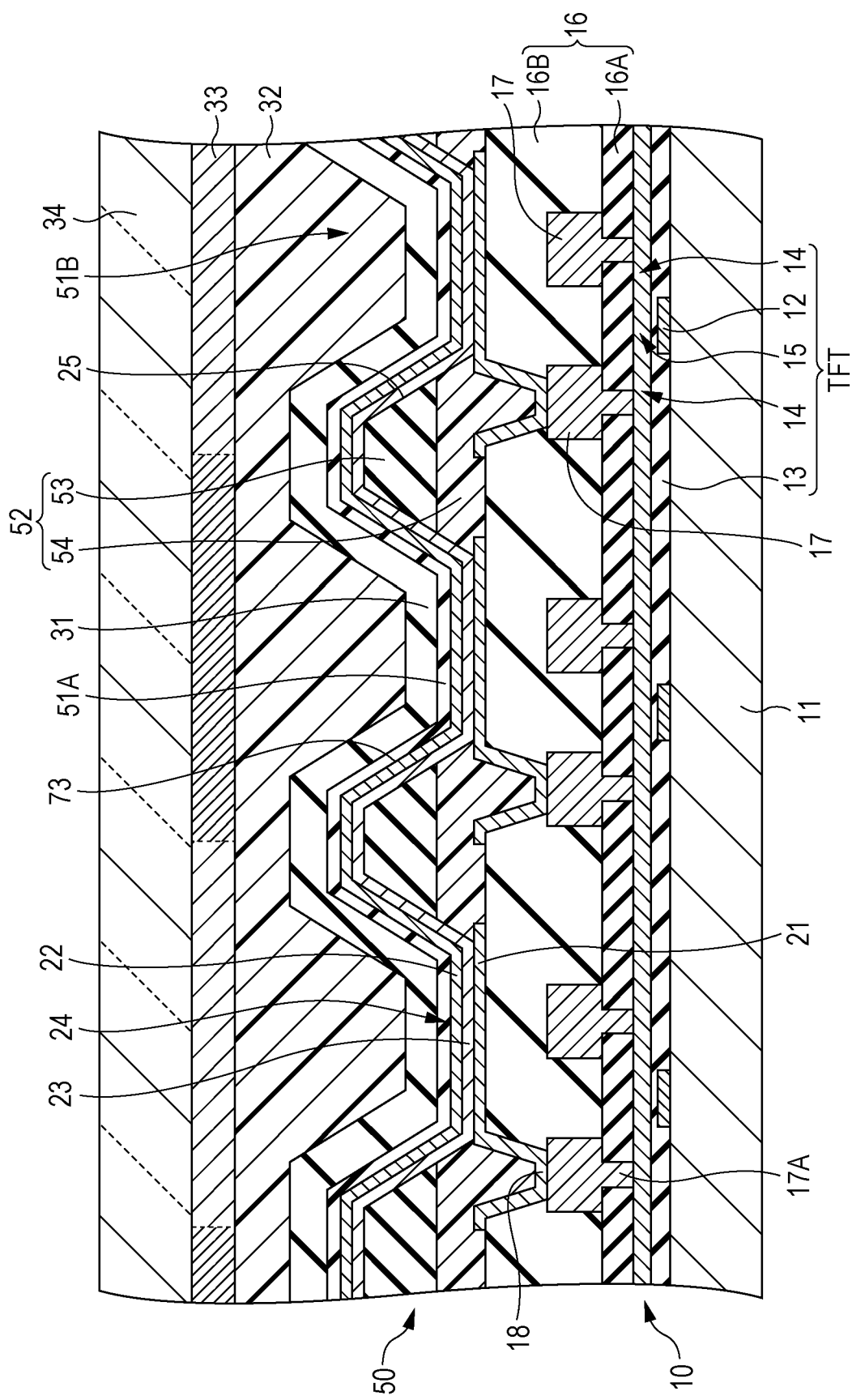
FIG. 7 is a schematic partial cross-sectional view of a light emitting apparatus according to Example 7.

Example 7 is a modification of Example 6. In Example 6, the top surface of the first members 51 and the top surface of the second members 52 are positioned on nearly the same plane. That is, portions between the second members 52 are filled with the first members 51. Meanwhile, in Example 7, as FIG. 7 illustrates a schematic partial cross-sectional view, and the layered first members 51A are formed in the portions between the second members 52. Specifically, the layered first members 51A having a refractive index $n_1$ of 1.806 and an average thickness of 0.2 μm are formed on the second electrode 22. Further, a region surrounded by the layered first members 51A that are positioned over the first electrodes 21 and formed on and over the second members 52 is referred to as a "region 51B". Subsequently, the insulating protecting film 31 made with silicon nitride ($Si_{1-y}N_y$) is formed on the entire surface, that is, in the region 51B and a region over the top surface of the second members 52. In addition, the sealing material layer 32 and the color filter 33 are formed on the protecting film 31. Further, a portion of the sealing material layer 32 is extended in the region 51B.

Except for the above, since the organic EL light emitting apparatus according to Example 7 has the same configurations and structures as in the organic EL light emitting apparatus according to Example 6, the detailed description is omitted.

In Example 7A, the light amount ratio when difference ($|n_1-n_3|$) between the refractive index $n_1$ of the layered first members 51A and the refractive index $n_3$ of the protecting film 31 is set to be constant (=0.2) and the refractive index $n_1$ of the first members 51A is changed is simulated. Here, the light amount according to Comparative Example 6B is set to be "1.00". In addition, the refractive index $n_2$ of the second members 52 is set to be 1.61. Further, parameters of the light reflecting layer of the organic EL light emitting apparatus according to Example 7A are the same as the parameters (see Table 5) and the array of the sub-pixel of the light reflecting layer of the organic EL light emitting apparatus according to Example 6B.

As a result of the simulation, it is found that if a difference between the refractive index $n_1$ of the layered first members 51A and the refractive index $n_3$ of the protecting film 31 is 0.2, the layered first members 51A can sufficiently perform a function as a light reflecting portion (reflector). In addition, it is found that if the refractive index $n_1$ of the layered first members 51A is higher than the refractive index $n_3$ of the protecting film 31, the light amount ratio is decreased. Further, when a relationship between a viewing angle and a relative value of brightness (when brightness at a viewing angle of 0° according to Comparative Example 6B is regulated to be "1") is examined, it is found that if ($n_3-n_1$) is less than 0.2, a relative value of brightness from a viewing angle of −90° to a viewing angle of −40° is increased, a relative value of brightness from a viewing angle of approximately −40° to a viewing angle of 0° is decreased, a relative value of brightness from a viewing angle of 0° to a viewing angle of approximately 40° is increased again, and a relative value of brightness from a viewing angle of approximately 40° to a viewing angle of 90° is decreased again, that is, it is found that the relative value of brightness has two peaks, and brightness when the organic EL light emitting apparatus is viewed from the front surface is decreased. According to the simulation result described above, a conclusion in which the value ($=n_3-n_1$) obtained by subtracting the refractive index $n_1$ of the layered first members 51A from the refractive index $n_3$ of the protecting film 31 is preferably 0.2 or more is obtained.

In addition, in Example 7B, the light amount ratio when the refractive index $n_3$ of the protecting film 31 is constantly set to be 1.8 and the refractive index $n_4$ of the sealing material layer 32 extending to the inside of the region 51B is changed is simulated. Here, the refractive index $n_2$ of the second members 52 is set to be 1.61, and the refractive index $n_1$ of the layered first members 51A is set to be 1.806. In addition, a relationship between a viewing angle and a relative value of brightness (a value obtained by regulating brightness at a viewing angle of 0° to "1") is examined. The parameters of the light reflecting layer of the organic EL light emitting apparatus according to Example 7B are the same as the parameters (see Table 5) and the array of the sub-pixels of the light reflecting layer of the organic EL light emitting apparatus according to Example 6B.

As a result of the simulation, it is found that, as the difference between the refractive index $n_3$ of the protecting film 31 and the refractive index $n_4$ of the sealing material layer 32 is decreased, the light amount ratio is decreased, and the relative value of brightness in a case of the large value of the viewing angle is increased to be greater than in the case of the viewing angle of 0°. In addition, it is found that when the refractive index $n_3$ of the protecting film 31 is set to be 1.8, the refractive index $n_4$ of the sealing material layer 32 is preferably 1.5 or more. That is, it is found that $|n_3-n_4| \leq 0.3$ is preferably satisfied.

Further, in Examples 7C and 7D, with respect to the organic EL light emitting apparatus that has parameters that are the same as parameters (see Table 5) of the light reflecting layer of the organic EL light emitting apparatus according to Example 6B and the array that is the same as the array of the sub-pixels of the light reflecting layer of the organic EL light emitting apparatus according to Example 6B, the light amount ratio when the value of $R_2$ is changed is simulated.

As a result of the simulation, it is found that the ratio of the light amount is increased as the value of $R_2/R_1$ is increased, but the increase proportion of the light amount ratio is decreased as the value of $R_2/R_1$ approaches "2.00". In addition, when a relationship between the viewing angle and the relative value of brightness (a value obtained by regulating the brightness at the viewing angle of 0° according to Comparative Example 6B is set to be "1") is examined, it is found that if the value of $R_2/R_1$ is 1.5 or less, as a viewing angle is increased from a viewing angle of −90°, the relative value of brightness is increased to reach a first maximum value, is decreased, reaches a minimum value at a viewing angle of 0°, is increased, reaches a second maximum value, and then is decreased. From the result described above, it is found that the value of $R_2/R_1$ is preferably 1.6 or more and 2.0 or less.

EXAMPLE 8

Figure 8:
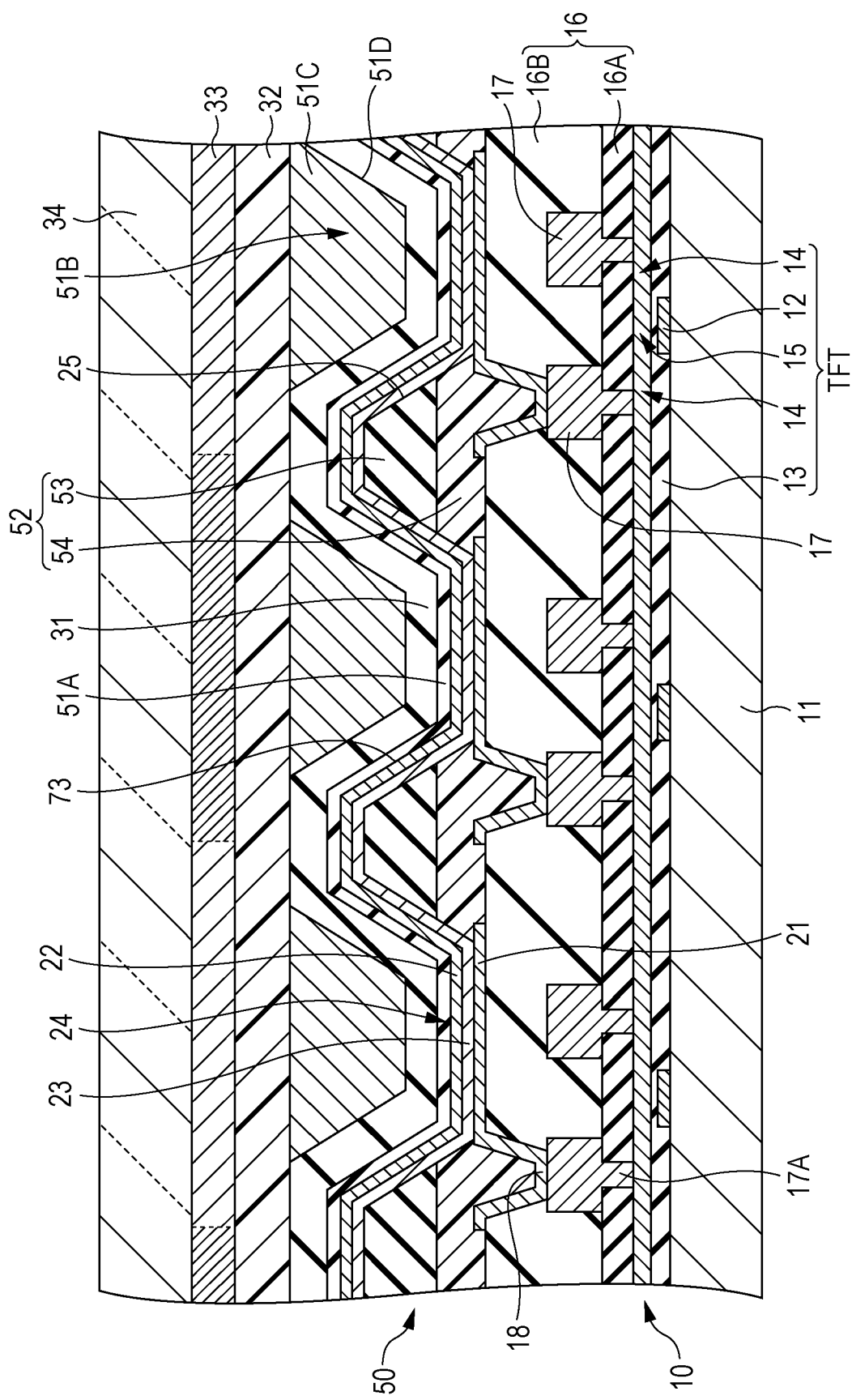
FIG. 8 is a schematic partial cross-sectional view of a light emitting apparatus according to Example 8.

Example 8 is also a modification of Example 6. As FIG. 8 illustrates a schematic partial cross-sectional view of the organic EL light emitting apparatus according to Example 8, a high refractive index region 51C having a refractive index $n_5$ higher than the refractive index $n_3$ of the protecting film 31 is provided instead of extending a portion of the sealing material layer 32 to the inside of the region 51B. Most light that enters the high refractive index region 51C from the protecting film 31 and collides with an inclined plane 51D which is an interface between the protecting film 31 and the high refractive index region 51C returns to the high refractive index region 51C. As a result, the light extraction efficiency of the light from the light emitting device to the outside can be enhanced. Further, for example, it is preferable to satisfy $$n_5-n_3 \geq 0.3.$$

Except for the above, since the organic EL light emitting apparatus according to Example 8 has the same configurations and structures as the organic EL light emitting apparatus according to Example 6, the detailed description is omitted.

EXAMPLE 9

Figure 9:
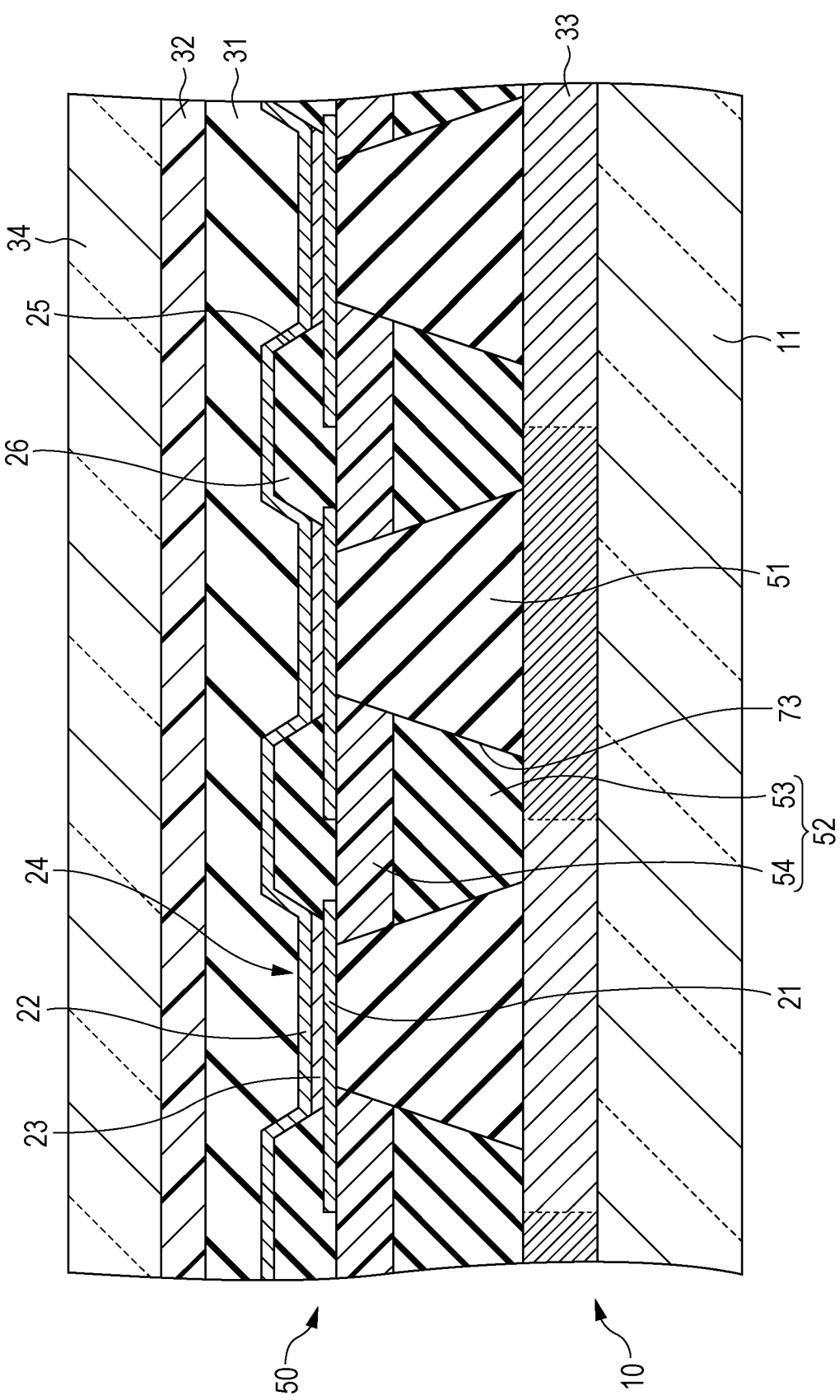
FIG. 9 is a schematic partial cross-sectional view of a light emitting apparatus according to Example 9.

Though Example 9 is also a modification of Example 6, light from each light emitting device 10 according to Example 9 is emitted to the outside through the first substrate 11. That is, the light emitting apparatus according to Example 9 is a lower surface light emitting-type light emitting apparatus. FIG. 9 illustrates a schematic partial cross-sectional view of the light emitting apparatus (the organic EL light emitting apparatus is an active matrix-type color display) according to Example 9. Further, the array of the sub-pixels is as illustrated in FIGS. 13A and 13B.

The first members 51 have truncated cone shapes (or a truncated rotating body shape) and are configured to satisfy, for example, $$R_1=2.3\mu m,$$

$$R_2=3.8\mu m,$$

$$R_1/R_2=0.61,$$

$$H=1.5\mu m,$$

$$R_0=2.0\mu m,$$

$$0.5 \leq R_1/R_2 \leq 0.8, \text{ and}$$

$$0.5 \leq H/R_1 \leq 2.0,$$

when the diameter of a light incident surface (a surface that faces the second substrate 34 in Example 9) is $R_1$, the diameter of a light emitting surface (a surface that faces the first substrate 11 in Example 9) is $R_2$, and a height is H. Further, the inclined plane of the truncated cone shape is linear. That is, the cross-sectional shape of the first member 51 when the first members 51 are cut through a virtual plane including axis lines of the first members 51 is a trapezoid.

In Example 9, the second electrode 22 is used as an anode electrode, and the first electrodes 21 are used as cathode electrodes. The second electrode 22 is made with a light reflecting material, specifically, an Al—Nd alloy, and the first electrodes 21 are made with a translucent material, specifically, a conductive material including magnesium (Mg), more specifically, a Mg—Ag alloy with a thickness of 10 nm. The second electrode 22 is formed by a film forming method such as a vacuum deposition method requesting less energy of film forming particles. In addition, the first electrodes 21 are formed based on the combination of the vacuum deposition method and the etching method. The measurement result of refractive indexes of the first electrodes 21 and the second electrode 22, the measurement result of the average light refractivity of the first electrodes 21, and the measurement result of the average light transmittance of the second electrode 22 are as described in Example 1. However, in the measurement values of Example 1, the "first electrode 21" is changed to "second electrode 22" and "second electrode 22" is changed to "first electrode 21".

In Example 9, the first electrodes 21 that configure the organic EL device are provided in the light reflecting layer 50 formed with the first members 51 and the second members 52. Then, the light reflecting layer 50 covers an organic EL device driving unit (not illustrated) formed on the first substrate 11. The organic EL device driving unit is configured with a plurality of TFTs, and the TFTs and the first electrodes 21 are electrically connected to each other through contact plugs and wires (not illustrated) provided in the second members 52. In some cases, an organic EL device driving unit may be provided in the upper portion of the light emitting unit 24.

In Example 9, the protecting film 31 and the sealing material layer 32 are further included on the light emitting unit 24 in the same manner as in Example 1. In addition, the light emitting unit 24 is surrounded by an insulating layer 26.

Radiation angle distribution of brightness of the organic EL light emitting apparatus according to Example 9A and the organic EL light emitting apparatus according to Comparative Example 9A is simulated. The organic EL light emitting apparatus according to Example 9A is obtained from organic EL light emitting apparatus having configurations and structures of Example 9, by performing setting in which $R_1 = 2.3 \mu m$ $R_2 = 3.8 \mu m$ $H = 1.5 \mu m$ the inclination angle of the inclined plane of the truncated cone-shaped first member is 63°, the thickness of the protecting film 31 is 3.0 μm, the thickness of the sealing material layer 32 is 10 μm, the thickness of the color filter 33 is 2.0 μm, and the diameter of the light emitting unit 24 (specifically, the diameter of the first electrodes 21) is 2.0 μm, and the organic EL light emitting apparatus according to Comparative Example 9A is obtained to have the same configurations and structures as in the organic EL light emitting apparatus according to Example 9A except for providing an $SiO_2$ layer instead of the light reflecting layer 50. As a result, if the radiation angle is within the range of ±10°, the brightness efficiency of the organic EL light emitting apparatus according to Example 9A is 2.2 times that of Comparative Example 9A. In addition, the density of driving current is 0.4 times that of Comparative Example 9A. In addition, if it is assumed that the color filter is deviated by 0.3 μm in the horizontal direction in the organic EL light emitting apparatus according to Example 9A, the brightness efficiency is 2.3 times that of Comparative Example 9A, the density of driving current is 0.5 times that of Comparative Example 9A, and the color mixing ratio is 1.3%.

Also in the organic EL light emitting apparatus according to Example 9, the refractive index $n_1$ of the first members 51 and a difference between the refractive index $n_1$ of the first members 51 and the average refractive index $n_{2-ave}$ of the second members 52 are regulated. Therefore, even if the light reflecting member or the like is not provided in the surface of the second members 52 that faces the first members 51 (that is, the interface between the first members 51 and the second members 52), that is, on the light reflecting portion 73, at least a portion of the light diffused in the first members 51 can be reliably reflected, and the light from each light emitting device 10 can be reliably prevented from being totally reflected by the first members 51. Further, the configurations of the organic EL light emitting apparatus according to Example 9 can be applied to the organic EL light emitting apparatus according to Example 6B to use the organic EL light emitting apparatus as a television receiver and in this case, the plurality of light emitting devices 10 may be collected to configure one sub-pixel similarly to Example 6B.

In addition, the light reflecting films 71 and 72 described in Examples 1 to 5 may be applied to the lower surface light emitting-type light emitting apparatus according to Example 9.

EXAMPLE 10

Figure 10:
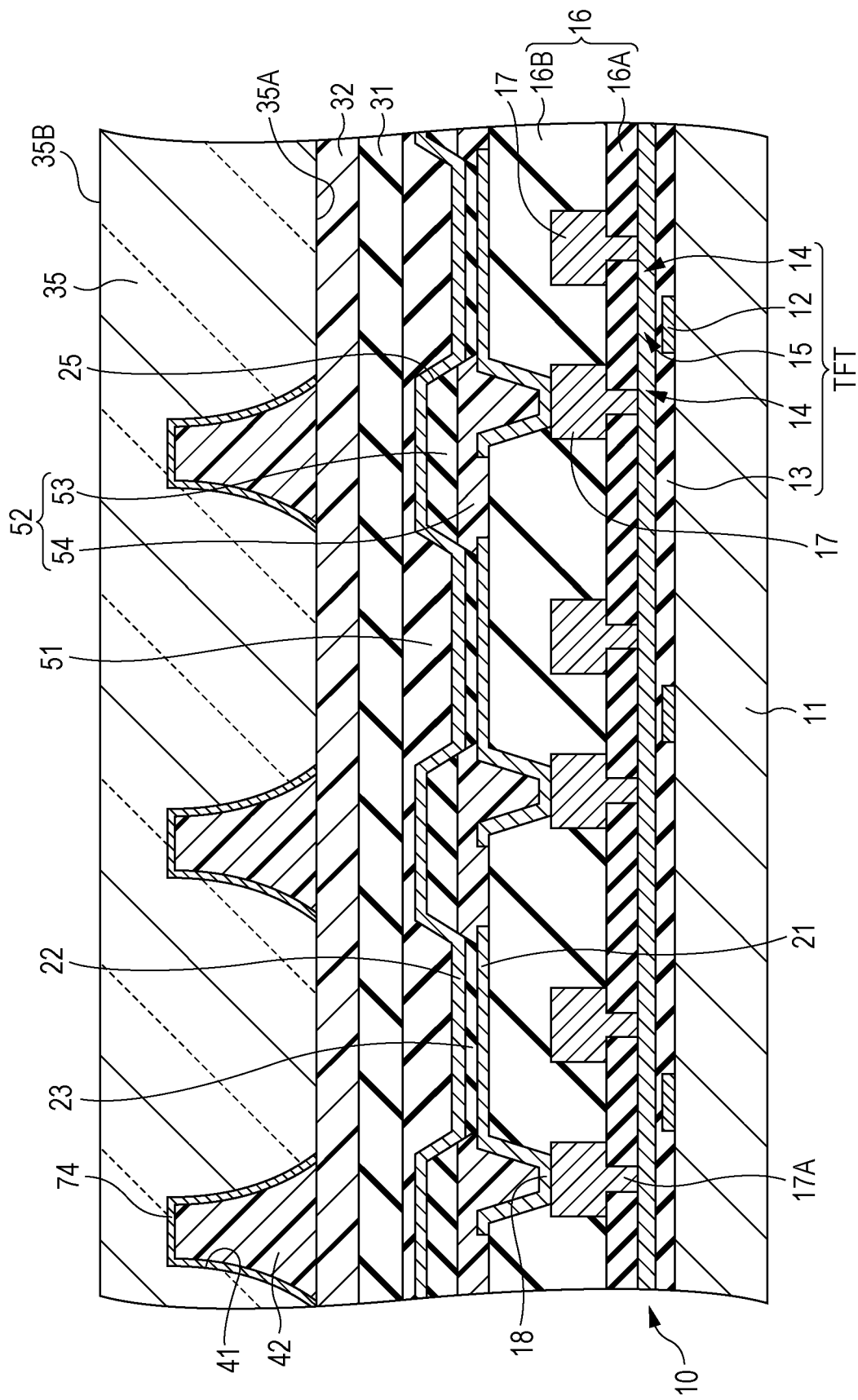
FIG. 10 is a schematic partial cross-sectional view of a light emitting apparatus according to Example 10.

Example 10 is also a modification of Examples 1 to 4, and relates to the organic EL light emitting apparatus according to the fourth embodiment of the present disclosure. As FIG. 10 illustrates a schematic partial cross-sectional view, in the organic EL light emitting apparatus according to Example 10 of the present disclosure, a light reflecting member (light reflecting film) 74 that reflects a portion of light that is emitted from the light emitting device 10, passes through the first members 51, and enters the second substrate 35 from a first surface 35A of a second substrate 35, and that emits the light from a second surface 35B of the second substrate 35 is formed on the second substrate 35. Here, the second substrate 35 is fixed in the upper portion of the second electrode 22, the first surface 35A faces the second electrode 22, and the second surface 35B faces the first surface 35A.

Figure 11:
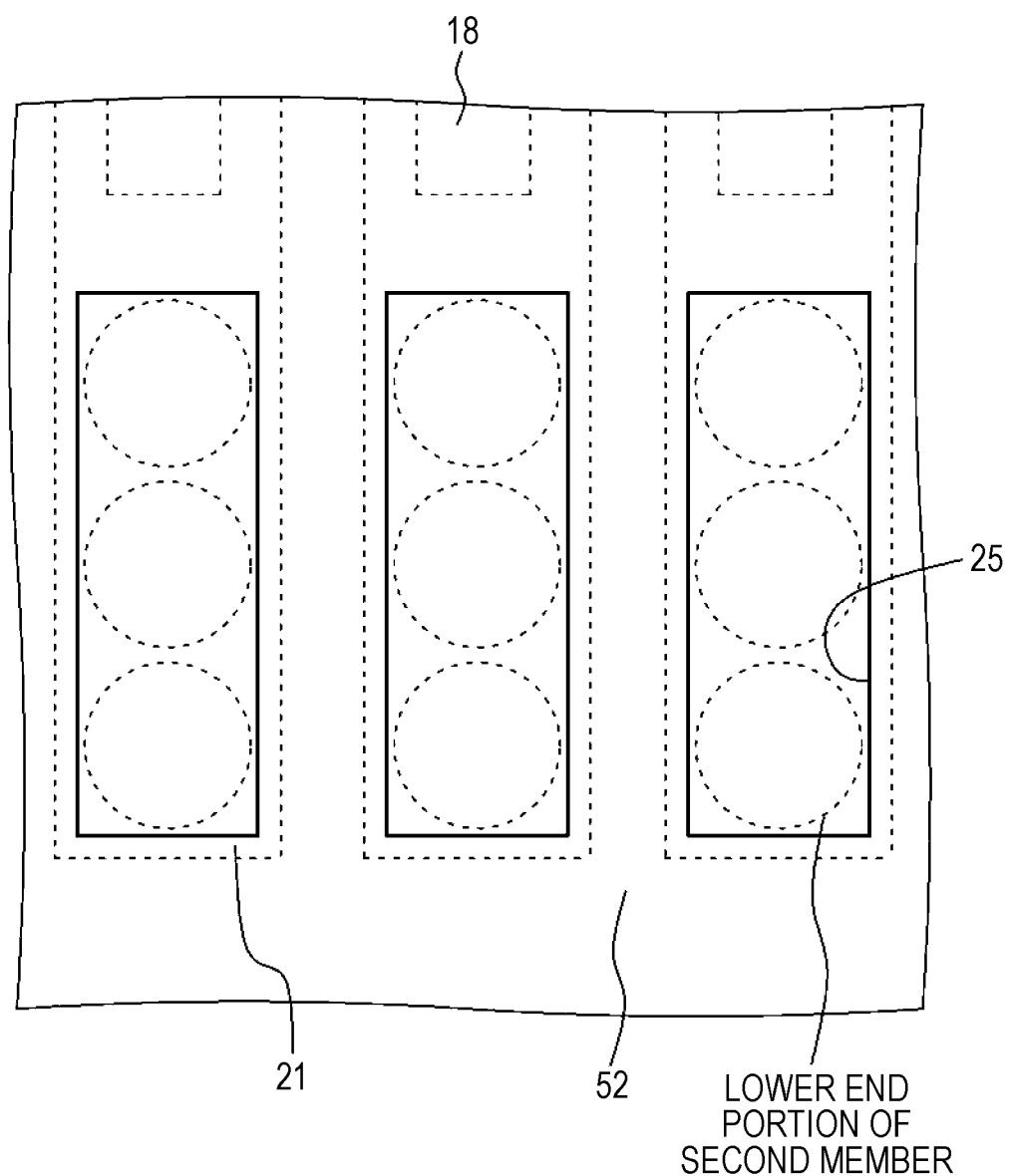
FIG. 11 is a partial plan view of the light emitting apparatus according to Example 10.

More specifically, the light reflecting member (light reflecting film) 74 that reflects a portion of the light, being emitted from the light emitting layer 23A through the second electrode 22, and entering the second substrate 35, and that emits the light from the second surface 35B of the second substrate 35 is formed to extend from the first surface 35A of the second substrate 35 to the inside. As FIG. 11 illustrates a schematic plot plan view, the array of the plurality of light emitting devices 10 is a stripe array, and the plurality of light reflecting members 74 are provided for one light emitting device 10.

Though it depends on configuring materials, the second substrate provided with a light reflecting member can be manufactured, for example, by a method of forming concave portions on a first surface using a stamper or forming concave portions on a first surface based on a cutting process, forming a light reflecting member on a surface exposed to the concave portions, and then embedding the concave portions.

That is, as illustrated in FIG. 10, the light reflecting member 74 can be manufactured, for example, by a method of forming concave portions 41 on the first surface 35A of the second substrate 35 by a cutting process, forming the light reflecting member 74, for example, based on a vacuum deposition method on a surface exposed to the concave portions 41, and embedding the concave portions 41 with a filling material 42 made with, for example, an acrylic resin. Further, instead of using the filling material 42, the adhesive layer 32 may be used to embed the concave portions 41 together with bonding the second substrate 35.

Hereinafter, another method of manufacturing, for example, the second substrate 35 having the light reflecting member (light reflecting film) 74 is described with reference to FIGS. 19A, 19B, 19C, and 19D. Specifically, first, a stamper (female mold) 66 having a shape complementary to the light reflecting member 74 is formed by using a technique according to the related art such as electroforming, etching, and other cutting processes. Then, for example, an ultraviolet ray curable resin composition 68 is applied on a supporting substrate 67 made with a glass substrate having optical transparency (see FIG. 19A), and the resin composition 68 is shaped using the stamper 66. Specifically, after a resin composition cured material 68A is obtained by radiating an ultraviolet ray in a state in which the stamper 66 is pressed against the resin composition 68 (see FIG. 19B), the stamper 66 is removed, and then unevenness portions having a shape of the light reflecting member can be formed on the surface of the resin composition cured material 68A. Thereafter, a metal reflecting layer (or a multi-layered thin film) 74' made with metal with high light reflectivity such as Al or Ag is formed on the surface of the resin composition cured material 68A, for example, by a vacuum deposition method (see FIG. 19C). Subsequently, a portion (convex portion) of the resin composition cured material 68A on which the metal reflecting layer 74' is stacked is cut and removed, for example, by a lapping process (see FIG. 19D). Thereafter, the concave portions 41 are embedded with the filling material 42 so that the second substrate 35 having the light reflecting member 74 can be obtained.

In the above, the present disclosure has been described based on preferred examples, but the present disclosure is not limited to the examples. The configurations and structures of the organic EL light emitting apparatus or the organic EL devices, and the materials that configure the organic EL light emitting apparatus or the organic EL devices according to the examples are presented as examples, and can be appropriately modified.

Further, the present disclosure can have the following configurations.

[A01] <Light emitting apparatus>

A light emitting apparatus including:

(A) a first substrate that includes a plurality of light emitting devices each obtained by stacking a first electrode, a light emitting unit configured with an organic layer including a light emitting layer, and a second electrode; and (B) a second substrate that faces the first substrate, in which the first substrate includes a first member that diffuses light from each light emitting device and emits the light to the outside, and a second member that occupies portions between the first members, and a light absorbing layer is provided in the second member.

[A02] The light emitting apparatus according to [A01], in which at least a portion of light diffused in the first member is reflected on an interface between the first member and the second member.

[A03] The light emitting apparatus according to [A01], in which a light reflecting film is formed on the interface between the first member and the second member.

[A04] The light emitting apparatus according to [A01], in which $$1.1 \leq n_1 \leq 1.8 \text{ and}$$

$$n_1 - n_{2\text{-}ave} \geq 0.2$$

are satisfied, when a refractive index of a material configuring the first member is $n_1$, and an average refractive index of a material configuring the second member that includes the light absorbing layer is $n_{2\text{-}ave}$.

[A05] The light emitting apparatus according to [A04], in which the first member is made with $Si_{1-x}N_x$, ITO, IZO, $TiO_2$, $Nb_2O_5$, a bromine-containing polymer, a sulfur-containing polymer, a titanium-containing polymer, or a zirconium-containing polymer, and the second member except for the light absorbing layer is made with $SiO_2$, MgF, LiF, a polyimide resin, an acrylic resin, a fluorine-based resin, a silicone resin, a fluorine-based polymer, or a silicone-based polymer.

[A06] The light emitting apparatus according to [A01], in which the light reflecting member that reflects at least a portion of light being emitted from the light emitting device, passing through the first member, and entering the second substrate from the first surface of the second substrate, and that emits the light from the second surface of the second substrate is formed on the second substrate.

[A07] The light emitting apparatus according to any one of [A01] to [A06], further including a protecting film and a sealing material layer on the first member and the second member, in which $$|n_3 - n_4| \leq 0.3$$

is satisfied, when a refractive index of a material configuring the protecting film is $n_3$, and a refractive index of a material configuring the sealing material layer is $n_4$.

[A08] The light emitting apparatus according to [A07], in which when a light amount of light from a center portion of the light emitting device is set to be 1, a light amount of light emitted from the light emitting device to the outside through the first member and the second substrate ranges from 1.5 to 2.0.

[A09] The light emitting apparatus according to any one of [A01] to [A08], in which the light absorbing layer is provided in a lower portion of the second member.

[A10] The light emitting apparatus according to any one of [A01] to [A08], in which the light absorbing layer is provided in a middle portion of the second member.

[A11] The light emitting apparatus according to any one of [A01] to [A08], in which the light absorbing layer is provided in a top portion of the second member.

[A12] The light emitting apparatus according to any one of [A01] to [A08], in which the light absorbing layer occupies an entire portion of the second member.

[A13] The light emitting apparatus according to any one of [A01] to [A12], further including a color filter.

[A14] The light emitting apparatus according to any one of [A01] to [A13], in which the light emitting device and the first member are in contact with each other.

[A15] The light emitting apparatus according to any one of [A01] to [A14], in which light from each light emitting device is emitted to the outside through the second substrate.

[A16] The light emitting apparatus according to any one of [A01] to [A15], in which one pixel is configured with one light emitting device.

[A17] The light emitting apparatus according to [A16], in which the first member has a truncated cone shape, and $$0.5 \leq R_1/R_2 \leq 0.8 \text{ and}$$

$$0.5 \leq H/R_1 \leq 2.0$$

are satisfied, when a diameter of the light incident surface is $R_1$, a diameter of the light emitting surface is $R_2$, and a height is H.

[A18] The light emitting apparatus according to any one of [A01] to [A15], in which a plurality of light emitting devices are collected to configure one pixel.

[A19] The light emitting apparatus according to [A18], in which the first member has a truncated cone shape, and $0.5 \leq R_1/R_2 \leq 0.8$ and $0.5 \leq H/R_1 \leq 2.0$ are satisfied, when a diameter of the light incident surface is $R_1$, a diameter of the light emitting surface is $R_2$, and a height is H.

[B01] <Light emitting apparatus>
A light emitting apparatus including:
a substrate including a plurality of light emitting devices, wherein the substrate further includes a plurality of first members configured to diffuse light emitted from at least one of the light emitting devices, and a second member that is positioned between the first members, and wherein the second member includes a light absorbing layer.

[B02] The light emitting apparatus according to [B01], wherein at least a portion of light diffused in at least one of the first members is reflected on an interface between the first members and the second member.

[B03] The light emitting apparatus according to [B01], wherein a light reflecting film is formed on an interface between at least one of the first members and the second member.

[B04] The light emitting apparatus according to [B01], wherein at least one of the first members includes a first material having a refractive index ($n_1$), wherein the second member includes a second material having an average refractive index ($n_{2-ave}$), and wherein $1.1 \leq n_1 \leq 1.8$ and $n_1 - n_{2-ave} \geq 0.2$.

[B05] The light emitting apparatus according to [B01], further including a light reflecting member that reflects at least a portion of light being emitted from the light emitting device, and passing through the first member.

[B06] The light emitting apparatus according to [B01], further comprising: a protecting film and a sealing material layer on the first members and the second member, wherein the protecting film includes a protecting film material having a refractive index ($n_3$), wherein the sealing material layer includes a sealing material having a refractive index ($n_4$), and wherein $|n_3 - n_4| \leq 0.3$.

[B07] The light emitting apparatus according to [B01], wherein the light absorbing layer is provided in a lower portion of the second member.

[B08] The light emitting apparatus according to [B01], wherein the light absorbing layer is provided in a middle portion of the second member.

[B09] The light emitting apparatus according to [B01], wherein the light absorbing layer is provided in a top portion of the second member.

[B10] The light emitting apparatus according to [B01], wherein the light absorbing layer occupies an entire portion of the second member.

[B11] The light emitting apparatus according to [B01], further comprising a color filter.

[B12] The light emitting apparatus according to [B01], wherein the light emitting devices and the first members are in contact with each other.

[B13] The light emitting apparatus according to [B01], wherein light from the light emitting devices is emitted outside the light emitting apparatus through the substrate.

[B14] The light emitting apparatus according to [B01], wherein the light emitting devices include a first electrode, a second electrode, and a light emitting unit having an organic layer, and wherein the organic layer includes a light emitting layer.

[B15] The light emitting apparatus according to [B01], wherein the substrate includes a first substrate including the light emitting devices, the first member, and the second member; and a second substrate facing the first substrate.

[B16] The light emitting apparatus according to [B01], wherein the light absorbing layer is in proximity of an outside portion of the second member.

[C01] An electronic apparatus comprising a light emitting apparatus including a substrate, the substrate including a plurality of light emitting devices, wherein the substrate further includes a plurality of first members and a second member positioned between the first members, wherein the first members are configured to diffuse and emit light, and wherein the second member includes a light absorbing layer.

[C02] The electronic apparatus according to [C01], wherein the electronic apparatus includes a mobile device.

[C03] The electronic apparatus according to [C02], wherein the mobile device is a tablet or a smartphone.

It should be understood by those skilled in the art that the term "substrate" as used herein includes one or more than one substrate, such as a first substrate and a second substrate, and as described in the present disclosure.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device comprising:
   a layer including SiO2;
   a first member including a first resin provided on the layer including SiO2 in a non-luminous region;
   a light emitting device comprising a first electrode, an organic layer formed on the first electrode and a second electrode formed on the organic layer; and
   a second member including a second resin, and the second member being in contact with the first member and the light emitting device;
   wherein the first member and an insulating layer are partially overlapped in a cross sectional view,
   wherein the first electrode comprises a transparent conductive material and the second electrode comprises a reflective material, and light generated in the organic layer is extracted from the first electrode, and
   wherein the second member is in contact with the first electrode in a display region.

2. The display device according to claim 1, wherein the first member is configured to absorb the light extracted from the first electrode.

3. The display device according to claim 1, wherein the first member is a single layer.

4. The display device according to claim 1, wherein an absorptivity of visible light of the first member is 90% or more.

5. The display device according to claim 1, wherein an absorptivity of visible light of the first member is 99% or more.

6. The display device according to claim 1, wherein the first resin includes a dye or a pigment.

7. The display device according to claim 6, wherein the dye is a black dye and the pigment is a black pigment.

8. The display device according to claim 1, wherein the second resin includes at least a polyimide resin, an acrylic resin, a fluorine-based resin, or a silicone resin.

9. The display device according to claim 1, wherein the insulating layer is disposed between the light emitting devices.

10. The display device according to claim 1, wherein a refractive index of the insulating layer is different from the average refractive index of the layer including SiO2 and the first member.

11. The display device according to claim 1, further comprising:
a light reflecting layer is formed with the second member and the first member.

12. A display device comprising:
a layer including SiO2;
a plurality of first members including a first resin provided on the layer including SiO2 in a non-luminous region;
a plurality of light emitting devices including a first electrode, an organic layer formed on the first electrode and a second electrode formed on the organic layer; and
a second member including a second resin provided in contact with at least two of the plurality of first members;
wherein an insulating layer located between adjacent two of the plurality of light emitting devices and the first member are partially overlapped in a cross sectional view,
wherein the first electrode comprises a transparent conductive material and the second electrode comprises a reflective material, and light generated in the organic layer is extracted from the first electrode, and
wherein the second member is in contact with the layer including SiO2 in a display region.

13. The display device according to claim 12, wherein the first member is configured to absorb the light extracted from the first electrode.

14. The display device according to claim 12, wherein each of the plurality of first members are a single layer.

15. The display device according to claim 12, wherein an absorptivity of visible light of each of the first members is 90% or more.

16. The display device according to claim 12, wherein an absorptivity of visible light of each of the first members is 99% or more.

17. The display device according to claim 12, wherein the first resin includes a dye or a pigment.

18. The display device according to claim 17, wherein the dye is a black dye and the pigment is a black pigment.

19. The display device according to claim 12, wherein each of the plurality of the second members includes at least a polyimide resin, an acrylic resin, a fluorine-based resin, or a silicone resin.

20. The display device according to claim 12, wherein a refractive index of each of the second members is different from the average refractive index of the layer including SiO2 and the first member.

21. The display device according to claim 12, further comprising:
a light reflecting layer is formed with each of the plurality of the second members and each of the plurality of the first members.

* * * * *